US012638878B2

(12) United States Patent
Huh et al.

(10) Patent No.: US 12,638,878 B2
(45) Date of Patent: May 26, 2026

(54) FOLDABLE ELECTRONIC DEVICE INCLUDING ANTENNA

(71) Applicant: SAMSUNG ELECTRONICS CO., LTD., Suwon-si (KR)

(72) Inventors: Jaeyoung Huh, Suwon-si (KR); Sungchul Park, Suwon-si (KR); Seunggil Jeon, Suwon-si (KR); Jonghoon Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 286 days.

(21) Appl. No.: 18/243,464

(22) Filed: Sep. 7, 2023

(65) Prior Publication Data

US 2023/0418328 A1      Dec. 28, 2023

Related U.S. Application Data

(63) Continuation of application No. PCT/KR2022/003355, filed on Mar. 10, 2022.

(30) Foreign Application Priority Data

Mar. 10, 2021    (KR) ........................ 10-2021-0031637

(51) Int. Cl.
| | |
|---|---|
| *G06F 1/00* | (2006.01) |
| *G06F 1/16* | (2006.01) |
| *H05K 5/02* | (2006.01) |

(52) U.S. Cl.
CPC .......... *G06F 1/1618* (2013.01); *G06F 1/1652* (2013.01); *G06F 1/1681* (2013.01); *G06F 1/1698* (2013.01); *H05K 5/0226* (2013.01)

(58) Field of Classification Search
CPC .... G06F 1/1618; G06F 1/1652; G06F 1/1681; G06F 1/1698; G06F 1/1677;

(Continued)

(56) References Cited

U.S. PATENT DOCUMENTS

| | | | |
|---|---|---|---|
| 2003/0129950 A1 | 7/2003 | Kwak | |
| 2003/0228884 A1* | 12/2003 | Iwai .................... | H04M 1/0216 |
| | | | 455/562.1 |

(Continued)

FOREIGN PATENT DOCUMENTS

| | | | | |
|---|---|---|---|---|
| EP | 3686712 A1 * | 7/2020 | ........... | H05K 5/0226 |
| EP | 3 883 221 A1 | 9/2021 | | |

(Continued)

OTHER PUBLICATIONS

International Search Report (PCT/ISA/210) issued on Jun. 9, 2022 the International Searching Authority in International Patent Application No. PCT/KR2022/003355.

(Continued)

*Primary Examiner* — Ping Y Hsieh
(74) *Attorney, Agent, or Firm* — Sughrue Mion, PLLC

(57)    ABSTRACT

A foldable electronic device includes a first housing in which a first component is provided, a second housing in which a second component is provided, a hinge foldably connecting the first housing and the second housing, a flexible display extending from a first surface of the first housing to a first surface of the second housing and across an area in which the hinge is provided, and a coupler configured to transmit a signal between the first component and the second component, the coupler including a first coupler connected to the first component and a second coupler connected to the second component and provided at a position corresponding to the first coupler, the second coupler configured to transmit or receive a signal to or from the first coupler by coupling to the first coupler in a first state of the foldable electronic device.

18 Claims, 20 Drawing Sheets

(58) Field of Classification Search

CPC ..... G06F 1/1616; H05K 5/0226; H01P 1/064; H01Q 1/243; H01Q 1/44; H01Q 13/06; H01Q 21/0006; H01Q 21/28; H01Q 1/38; G09F 9/301

See application file for complete search history.

(56) References Cited

U.S. PATENT DOCUMENTS

| | | | |
|---|---|---|---|
| 2006/0050169 A1 | 3/2006 | Misawa | |
| 2007/0052596 A1 | 3/2007 | Liu et al. | |
| 2007/0229373 A1 | 10/2007 | Mashima et al. | |
| 2007/0297125 A1 | 12/2007 | Maatta | |
| 2008/0100514 A1 | 5/2008 | Abdul-Gaffoor et al. | |
| 2010/0067186 A1 | 3/2010 | Aya et al. | |
| 2011/0018773 A1* | 1/2011 | Hikino | H01Q 1/52 |
| | | | 343/702 |
| 2011/0194240 A1 | 8/2011 | Hansen et al. | |
| 2012/0106106 A1 | 5/2012 | Katou | |
| 2013/0321216 A1 | 12/2013 | Jervis et al. | |
| 2018/0316379 A1* | 11/2018 | Chang | H01Q 1/245 |
| 2018/0366813 A1 | 12/2018 | Kim et al. | |
| 2019/0069451 A1 | 2/2019 | Myers et al. | |
| 2020/0119429 A1 | 4/2020 | Park et al. | |
| 2020/0195336 A1* | 6/2020 | Raghavan | H04B 7/0874 |
| 2020/0267839 A1* | 8/2020 | Woo | G06F 1/1681 |
| 2020/0333855 A1* | 10/2020 | Kim | G06F 1/1681 |
| 2020/0350939 A1 | 11/2020 | Lee et al. | |

FOREIGN PATENT DOCUMENTS

| | | | | | |
|---|---|---|---|---|---|
| EP | 3 968 127 A1 | 3/2022 | | | |
| JP | 2008-211661 A | 9/2008 | | | |
| KR | 10-2003-0061073 A | 7/2003 | | | |
| KR | 10-2015-0042180 A | 4/2015 | | | |
| KR | 10-2017-0066944 A | 6/2017 | | | |
| KR | 10-2020-0031607 A | 3/2020 | | | |
| KR | 10-2020-0042611 A | 4/2020 | | | |
| KR | 10-2020-0121518 A | 10/2020 | | | |
| WO | WO-2018194558 A1 * | 10/2018 | .......... | G06F 1/1681 |
| WO | 2020/122598 A1 | 6/2020 | | | |
| WO | 2020/231083 A1 | 11/2020 | | | |

OTHER PUBLICATIONS

Written Opinion (PCT/ISA/237) issued on Jun. 9, 2022 by the International Searching Authority in International Patent Application No. PCT/KR2022/003355.

Communication issued Jul. 22, 2024 by the European Patent Office in the European Patent Application No. 22767527.9.

Communication dated Oct. 22, 2025, issued by Korean Intellectual Property Office in Korean Patent Application No. 10-2021-0031637.

* cited by examiner

FOLDABLE ELECTRONIC DEVICE INCLUDING ANTENNA

CROSS-REFERENCE TO RELATED APPLICATIONS

This application is a continuation of International Application No. PCT/KR2022/003355, filed on Mar. 10, 2022, in the Korean Intellectual Property Receiving Office, which is based on and claims priority to Korean Patent Application No. 10-2021-0031637, field on Mar. 10, 2021, in the Korean Intellectual Property Office, the disclosures of which are incorporated herein by reference in their entireties.

BACKGROUND

1. Field

The disclosure relates to a foldable electronic device including an antenna.

2. Description of Related Art

As mobile communication services have expanded to include multimedia services, users have been able to access multimedia services through their electronic devices in addition to voice calls and short messages. To make it easier for users to use multimedia services, electronic devices are increasingly equipped with large display panels. In addition, foldable electronic devices with flexible display panels have been developed in recent years.

To meet the growing demand for wireless data traffic after the commercialization of $4^{th}$ generation (4G) communication systems, efforts are being made to develop $5^{th}$ generation (5G) (next-generation) communication systems. Next-generation mobile communication services (e.g., 5G communication) may provide users with faster wireless communication networks. To achieve high data rates, such 5G communication systems may utilize high frequencies at or above tens of GHz (or "millimeter wave (mmWave) communication").

A foldable electronic device may include two housings in which electronic components may be disposed, and the two housings may be connected by a hinge. In order to use the foldable electronic device to manage a wide range of frequency bands from baseband to millimeter wave communications, the foldable electronic device may include an intermediate frequency integrated circuit (IC) (IFIC) for controlling a signal in a band below/above 10 GHz and a radio frequency (RF) IC (RFIC) for controlling a signal in a high frequency mmWave band, such as 28 GHz, 39 GHz, or 60 GHz. In some embodiments, because as the length of a wiring to an antenna is greater, a high-frequency signal in the mmWave band has a higher signal loss rate, the RFIC may be formed together with an antenna as an antenna module. A low-loss flexible printed circuit board (FPCB)-type RF cable (FRC) may be applied as a wiring connecting the IFIC to the antenna module. However, the FRC as the wiring connecting the IFIC to the antenna module may be damaged by repeated unfolding and folding operations of the foldable electronic device.

On the other hand, when the foldable electronic device is folded and mounted on the ground, or when a user grabs the foldable electronic device to watch a video, turn on a speaker, or play a game, the coverage of an antenna supporting the millimeter wave band may be limited, resulting in unsmooth communication between the foldable electronic device and an external electronic device (e.g., a base station or an external electronic device).

SUMMARY

Provided is a foldable electronic device to cope with a structural limitation of the foldable electronic device and reduced coverage of mmWave communications that may occur in during use of the foldable electronic device.

Additional aspects will be set forth in part in the description which follows and, in part, will be apparent from the description, or may be learned by practice of the presented embodiments.

According to an aspect of the disclosure, a foldable electronic device may include a first housing in which a first component is provided, a second housing in which a second component is provided, a hinge foldably connecting the first housing and the second housing, a flexible display extending from a first surface of the first housing to a first surface of the second housing and across an area in which the hinge is provided, and a coupler configured to transmit a signal between the first component and the second component, the coupler including a first coupler connected to the first component and a second coupler connected to the second component and provided at a position corresponding to the first coupler, the second coupler configured to transmit or receive a signal to or from the first coupler by coupling to the first coupler in a first state of the foldable electronic device.

The first state of the foldable electronic device may include an unfolded state of the foldable electronic device.

The first coupler and the second coupler may be provided adjacent to a rear surface of the flexible display and at a position corresponding to a folding area on the hinge.

The first coupler and the second coupler may be provided on a flexible printed circuit board (FPCB) comprising a rigid end, the first coupler may extend from the first housing and the second coupler may extend from the second housing.

The hinge may include at least one third antenna.

The device may include a third coupler connected to the first component and a fourth coupler connected to the at least one third antenna.

The fourth coupler may be provided at a position corresponding to the third coupler and the fourth coupler may be configured to transmit or receive a signal to or from the third coupler by coupling to the third coupler in a second state of the foldable electronic device.

The second state of the foldable electronic device may include a folded state or a state in which a folding angle between the first housing and the second housing is within a predetermined angular range.

The first coupler and the second coupler may be configured to transmit or receive a signal in a millimeter wave (mmWave) band.

The first component may include at least one first antenna and a processor and the second component may include at least one second antenna.

The at least one second antenna may include a repeater antenna configured to receive a first signal transmitted by the at least one first antenna from the second coupler coupled to the first coupler and transmit the first signal by the at least one second antenna based at least in part on a command from the processor.

The first coupler may be provided on a first side surface of the first housing and, when the second housing is folded with respect to the first housing, the second coupler may be on a side surface of the second housing that corresponds to the first side surface of the first housing.

The processor may be configured to control a signal gain based at least in part on a distance between the first coupler and the second coupler, the distance between the first coupler and the second coupler being determined based on a folding angle between the first housing and the second housing.

The processor may be configured to control beam forming based at least in part on a distance between the first coupler and the second coupler, the distance between the first coupler and the second coupler being determined based on a folding angle between the first housing and the second housing.

The hinge may include a waveguide antenna.

According to an aspect of the disclosure, a foldable electronic device may include a first housing, a second housing, a hinge connecting the first housing and the second housing, a flexible display extending from the first housing, across the hinge, to the second housing, a first coupler provided in the first housing, and a second coupler provided in the second housing, where, in an unfolded state of the foldable electronic device, the second coupler is configured to be coupled to the first coupler such that the second coupler transmits or receives a signal to or from the first coupler.

The hinge may include at least one antenna.

The device may include a third coupler provided in the first housing and a fourth coupler provided in the hinge and connected to the at least one antenna.

In a folded state of the foldable electronic device, the fourth coupler may be configured to be coupled to the third coupler such that the fourth coupler transmits or receives a signal to or from the third coupler.

According to an aspect of the disclosure, a foldable electronic device may include a first housing, a second housing, a hinge connecting the first housing and the second housing, a flexible display extending from the first housing, across the hinge, to the second housing, a first coupler provided in the first housing, a second coupler provided in the second housing, a third coupler provided in the first housing and a fourth coupler provided in the hinge, where, in an unfolded state of the foldable electronic device, the second coupler is configured to be coupled to the first coupler such that the second coupler transmits or receives a signal to or from the first coupler and where, in a folded state of the foldable electronic device, the fourth coupler is configured to be coupled to the third coupler such that the fourth coupler transmits or receives a signal to or from the third coupler.

BRIEF DESCRIPTION OF DRAWINGS

The above and other aspects, features, and advantages of certain embodiments of the present disclosure will be more apparent from the following description taken in conjunction with the accompanying drawings, in which.

DETAILED DESCRIPTION

Figure 1:
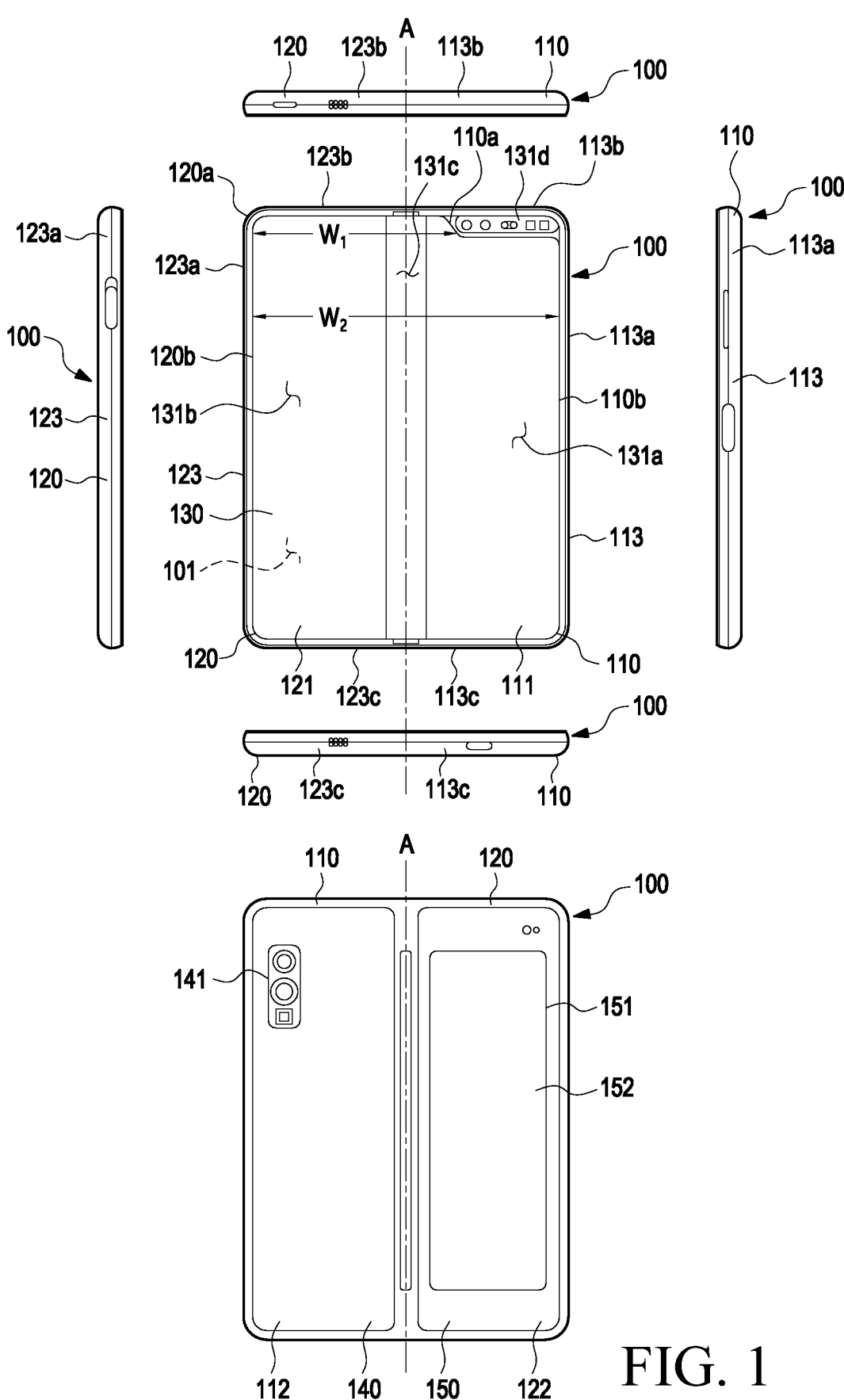
FIG. 1 is a diagram illustrating an unfolded state of an electronic device according to an embodiment of the disclosure.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms. It is to be understood that singular forms include plural referents unless the context clearly dictates otherwise. The terms including technical or scientific terms used in the disclosure may have the same meanings as generally understood by those skilled in the art.

Figure 2:
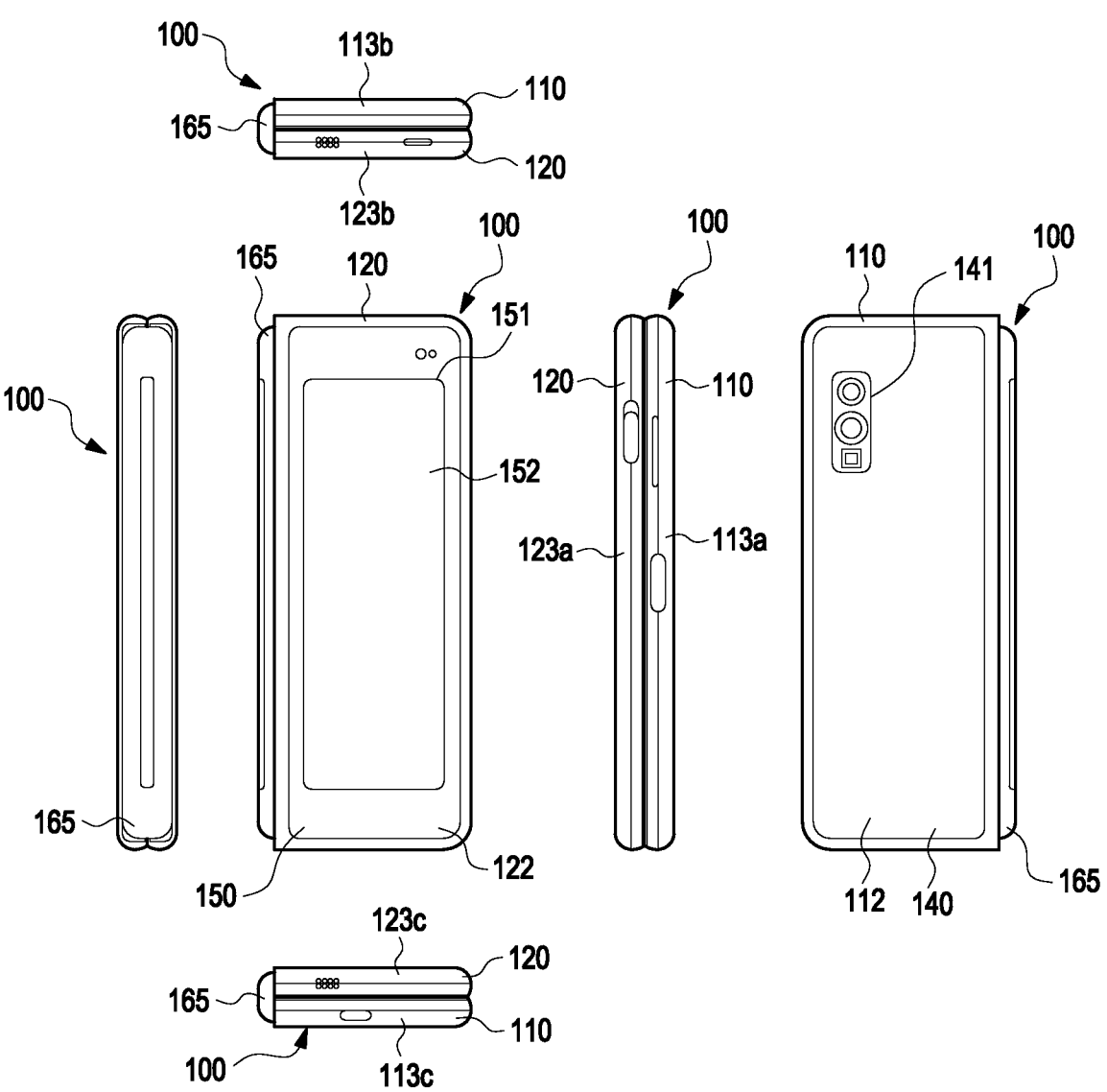
FIG. 2 is a diagram illustrating a folded state of the electronic device of FIG. 1 according to an embodiment of the disclosure.

FIG. 1 is a diagram illustrating an unfolded state of an electronic device 100 according to an embodiment of the disclosure. FIG. 2 is a diagram illustrating a folded state of the electronic device 100 according to an embodiment of the disclosure.

In the following description, a configuration in which a pair of housing structures (or referred to as 'housings') are foldably or rotatably coupled with each other by a hinge structure (or referred to as a 'hinge') is taken as an example. However, it should be noted that this embodiment does not limit an electronic device according to various embodiments of the disclosure. For example, the electronic device according to various embodiments of the disclosure may include three or more housing structures, and "a pair of housing structures" in the embodiments disclosed below may indicate "two housing structures foldably or rotatably coupled with each other among three or more housing structures".

Referring to FIG. 1, the electronic device 100 may include a pair of housing structures 110 and 120 that are foldably or rotatably coupled by a hinge structure (e.g., a hinge structure 164 of FIG. 3) to be folded with respect to each other, a hinge cover 165 that covers or at least partially covers foldable portions of the pair of housing structures 110 and 120, and a display 130 (e.g., a flexible display or a foldable display) disposed in a space formed by the pair of housing structures 110 and 120. In an embodiment, the electronic device 100 may include a foldable housing in which the pair of housing structures 110 and 120 are coupled to be rotatable from a position at which the pair of housing structures 110 and 120 face each other to a position at which the pair of housing structures 110 and 120 are unfolded in parallel with each other. Herein, a surface on which the display 130 is disposed may be defined as a front surface of the electronic device 100, and a surface opposite to the front surface may be defined as a rear surface of the electronic device 100. A surface surrounding a space between the front and rear surfaces may be defined as a side surface of the electronic device 100.

In an embodiment, the pair of housing structures 110 and 120 may include a first housing structure 110 including a sensor area 131*d*, a second housing structure 120, a first rear cover 140, and a second rear cover 150. The pair of housing structures 110 and 120 of the electronic device 100 may be configured in a different shape or by a combination and/or engagement of other components, not limited to the shape and engagement illustrated in FIGS. 1 and 2. For example, in another embodiment, the first housing structure 110 and the first rear cover 140 may be integrally formed, and the second housing structure 120 and the second rear cover 150 may be integrally formed. In another embodiment, the first housing structure 110 may include the first rear cover 140, and the second housing structure 120 may include the second rear cover 150.

According to an embodiment, the first housing structure 110 and the second housing structure 120 may be disposed, for example, on both sides of a folding axis A, and may be symmetrical in shape as a whole with respect to the folding axis A. A direction in which the folding axis A extends may be defined as a longitudinal direction (e.g., a Y-axis direction in FIG. 3) of the electronic device 200. In some embodiments, the first housing structure 110 and the second housing structure 120 may rotate around different folding axes with respect to the hinge structure 164 or the hinge cover 165. For example, each of the first housing structure 110 and the second housing structure 120 may be rotatably coupled with the hinge structure 164 or the hinge cover 165. As the first housing structure 110 and the second housing structure 120 rotate around the folding axis A or different folding axes, the first housing structure 110 and the second housing structure

120 may rotate between a folded position and either a position at which they are inclined with respect to each other or a position at which they are unfolded in parallel with each other.

Herein, the expression "located side by side" or "extended side by side" may refer to a state in which two structures (e.g., the housing structures 110 and 120) are at least partially located next to each other or a state in which parts of the two structures, located next to each other, are arranged in parallel. In some embodiments, "arranged side by side" may indicate that the two structures are disposed next to each other, facing parallel directions or the same direction. Although expressions such as "side by side" and "parallel" may be used in the following description, such terms may be understood according to the shapes or arrangement relationship of the structures with reference to the accompanying drawings.

According to an embodiment, the angle or distance between the first housing structure 110 and the second housing structure 120 may vary depending on whether the electronic device 100 is in an unfolded state (extended state, flat state, or opened state, etc.), a folded state (or closed state or substantially closed state), or an intermediate state (e.g., a partially opened state where the angle between the first housing structure 110 and the second housing structure 120 is greater than 0 but less than, for example, 90 degrees, 180 degrees, etc.). In describing various embodiments of the disclosure, the electronic device 100 being described as placed in the "unfolded state" may refer to a "fully unfolded state" in which the first housing structure 110 and the second housing structure 120 of the electronic device 100 form an angle of 180 degrees. When the electronic device 100 is described as being placed in the "folded state", this may refer to the first housing structure 110 and the second housing structure 120 of the electronic device forming an angle of 0 degrees or an angle less than 10 degrees. When the electronic device 100 is placed in the "intermediate state", this may refer to the first housing structure 110 and the second housing structure 120 forming an angle between the angle formed in the "unfolded state" and the angle formed in the "closed state".

According to an embodiment, while the first housing structure 110 further includes the sensor area 131*d* having various sensors arranged therein, unlike the second housing structure 120, the first housing structure 110 and the second housing structure 120 may be symmetrical with each other in shape in the remaining area except for the sensor area 131*d*. In another embodiment, the sensor area 131*d* may be additionally disposed in or replaced by at least a partial area of the second housing structure 120. In another embodiment, the sensor area 131*d* may be omitted, and at least a part of the display may be located in at least a part of the sensor area 131*d*.

In an embodiment, in the unfolded state of the electronic device 100, the first housing structure 110 may be connected to the hinge structure (e.g., the hinge structure 164 of FIG. 3), and include a first surface 111 facing the front surface of the electronic device 100, a second surface 112 facing in the opposite direction to the first surface 111, and a first side member 113 at least partially surrounding a space between the first surface 111 and the second surface 112. In an embodiment, the first side member 113 may include a first side surface 113*a* disposed in parallel with the folding axis A, a second side surface 113*b* extending from one end of the first side surface 113*a* in a direction perpendicular to the folding axis A, and a third side surface 113*c* extending from the other end of the first side surface 113*a* in the direction perpendicular to the folding axis A. In the description of various embodiments of the disclosure, an expression such as "parallel" or "perpendicular" is used to describe the arrangement relationship of the above-described side surfaces. However, the expression encompasses the meaning of "partially parallel" or "partially perpendicular" according to an embodiment. In some embodiments, the expression "parallel" or "perpendicular" may refer to an inclined arrangement relationship within an angle range of 10 degrees.

In an embodiment, the second housing structure 120 may be connected to the hinge structure (e.g., the hinge structure 164 of FIG. 3) and include a third surface 121 facing the front surface of the electronic device 100, a fourth surface 122 facing in the opposite direction to the third surface 121, and a second side member 123 at least partially surrounding a space between the third surface 121 and the fourth surface 122, in the unfolded state of the electronic device 100. In an embodiment, the second side member 123 may include a fourth side surface 123a disposed in parallel to the folding axis A, a fifth side surface 123b extending from one end of the fourth side surface 123a in the direction perpendicular to the folding axis A, and a sixth side surface 123c extending from the other end of the fourth side surface 123a in the direction perpendicular to the folding axis A. In an embodiment, the third surface 121 may be disposed to face the first surface 111 in the folded state. In some embodiments, although there may be some difference in specific shapes, the second side member 123 may be formed into substantially the same shape as the first side member 113 or may be formed of substantially the same material as the first side member 113.

In an embodiment, the electronic device 100 may include a recess 101 formed to accommodate the display 130 therein through structural shape coupling between the first housing structure 110 and the second housing structure 120. The recess 101 may have substantially the same size as the display 130. In an embodiment, the recess 101 may have two or more different widths in the direction perpendicular to the folding axis A due to the sensor area 131d. For example, the recess 101 may have a first width W1 between a first part 120a of the second housing structure 120 parallel to the folding axis A and a first part 110a of the first housing structure 110, formed at an edge of the sensor area 131d, and a second width W2 between a second part 120b of the second housing structure 120 and a second part 110b of the first housing structure 110, which does not correspond to the sensor area 131d and is parallel to the folding axis A. In this case, the second width W2 may be greater than the first width W1. For example, the recess 101 may be formed to have the first width W1 between the first part 110a of the first housing structure 110 to the first part 120a of the second housing structure 120 which are asymmetrical to each other, and the second width W2 between the second part 110b of the first housing structure 110 and the second part 120b of the second housing structure 120 which are symmetrical to each other. In an embodiment, the first part 110a and the second part 110b of the first housing structure 110 may be formed to have different distances from the folding axis A. The widths of the recess 101 are not limited to the illustrated example. In various embodiments, the recess 101 may have two or more different widths according to the shape of the sensor area 131d or the asymmetrical parts of the first housing structure 110 and the second housing structure 120.

In an embodiment, the first housing structure 110 and the second housing structure 120 may be at least partially formed of a metallic material or a non-metallic material, which has a rigidity selected to support the display 130. In another embodiment, at least parts of the first housing structure 110 and the second housing structure 120 may contain an electrically conductive material. When the first housing structure 110 and the second housing structure 120 contain the electrically conductive material, the electronic device 100 may transmit and receive radio waves using the parts of the electrically conductive material in the first housing structure 110 and the second housing structure 120. For example, a processor or a communication module of the electronic device 100 may perform wireless communication using the parts of the first housing structure 110 and the second housing structure 120.

In an embodiment, the sensor area 131d may be formed to have a predetermined area adjacent to one corner of the first housing structure 110. However, the arrangement, shape, or size of the sensor area 131d is not limited to the illustrated example. For example, in another embodiment, the sensor area 131d may be provided in any area adjacent to another corner of the first housing structure 110 or in any area between top and bottom corners of the first housing structure 110. In another embodiment, the sensor area 131d may be disposed in at least a partial area of the second housing structure 120. In another embodiment, the sensor area 131d may be disposed to extend to the first housing structure 110 and the second housing structure 120. In an embodiment, the electronic device 100 may include components exposed from the front surface of the electronic device 100 through the sensor area 131d or at least one opening formed in the sensor area 131d, and various functions may be executed by these components. The components arranged in the sensor area 131d may include, for example, at least one of a front camera device, a proximity sensor, an illuminance sensor, an iris recognition sensor, an ultrasonic sensor, or an indicator. However, the components are not limited to this embodiment. The sensor area 131d may be omitted according to an embodiment. According to the embodiment, the components arranged in the sensor area 131d may be distributed over at least a partial area of the first housing structure 110 and/or the second housing structure 120.

In an embodiment, the first rear cover 140 may be disposed on the second surface 112 of the first housing structure 110 and have a substantially rectangular periphery. In an embodiment, the periphery of the first rear cover 140 may be at least partially surrounded by the first housing structure 110. Similarly, the second rear cover 150 may be disposed on the fourth surface 122 of the second housing structure 120, and the periphery of the second rear cover 150 may be at least partially surrounded by the second housing structure 120.

In the illustrated embodiment, the first rear cover 140 and the second rear cover 150 may have a substantially symmetrical shape with respect to the folding axis A. In another embodiment, the first rear cover 140 and the second rear cover 150 may be in various different shapes. In another embodiment, the first rear cover 140 may be integrally formed with the first housing structure 110, and the second rear cover 150 may be integrally formed with the second housing structure 120.

In an embodiment, a structure in which the first rear cover 140, the second rear cover 150, the first housing structure 110, and the second housing structure 120 are coupled with each other may provide a space in which various components (e.g., a printed circuit board (PCB), an antenna, a sensor module, or a battery) may be arranged. As described herein, an "antenna" may refer to a component as a single antenna, an antenna array, an antenna module, etc. In an embodiment, one or more components may be disposed or visually exposed on the rear surface of the electronic device 100. For example, one or more components or sensors may be visually exposed through a first rear area 141 of the first rear cover 140. In various embodiments, the sensors may include a proximity sensor, a rear camera device, and/or a flash. In another embodiment, at least a part of a sub-display 152 may be visually exposed through a second rear area 151 of the second rear cover 150.

In an embodiment, the display 130 may be disposed in a space defined by the pair of housing structures 110 and 120. For example, the display 130 may be mounted in the recess (e.g., the recess 101 of FIG. 1) formed by the pair of housing structures 110 and 120, and occupy substantially most of the front surface of the electronic device 100. For example, the front surface of the electronic device 100 may include the display 130, and partial areas (e.g., peripheral areas) of the first and second housing structures 110 and 120 adjacent to the display 130. In an embodiment, the rear surface of the electronic device 100 may include the first rear cover 140, a partial area (e.g., a peripheral area) of the first housing structure 110 adjacent to the first rear cover 140, the second rear cover 150, and a partial area (e.g., a peripheral area) of the second housing structure 120 adjacent to the second rear cover 150.

In an embodiment, the display 130 may refer to a display which is at least partially deformable into a flat surface or a curved surface. In an embodiment, the display 130 may include a folding area 131c, a first area 131a disposed on one side of the folding area 131c (e.g., a right area of the folding area 131c), and a second area 131b disposed on the other side of the folding area 131c (e.g., a left area of the folding area 131c). For example, the first area 131a may be disposed on the first surface 111 of the first housing structure 110, and the second area 131b may be disposed on the third surface 121 of the second housing structure 120. For example, the display 130 may extend from the first surface 111 across the hinge structure 164 of FIG. 3 to the third surface 121, and at least an area corresponding to the hinge structure 164 (e.g., the folding area 131c) may be a flexible area deformable from the shape of a flat plate to the shape of a curved surface.

In an embodiment, the area division of the display 130 is exemplary, and the display 130 may be divided into a plurality of areas (e.g., two areas or four or more areas) according to its structure or function. For example, in the embodiment illustrated in FIG. 1, the folding area 131c may extend in a vertical direction (e.g., a Y axis of FIG. 3) parallel to the folding axis A, and the display 130 may be divided into areas with respect to the folding area 131c or the folding axis A. In another embodiment, the display 130 may be divided into areas with respect to a different folding area (e.g., a folding area parallel to a horizontal axis (e.g., an X axis of FIG. 3) or a different folding axis (e.g., a folding axis parallel to the X axis of FIG. 3). The above-described area division of the display 130 is only a physical division by the pair of housing structures 110 and 120 and the hinge structure (e.g., the hinge structure 164 of FIG. 3). The display 130 may display one full screen through substantially the pair of housing structures 110 and 120 and the hinge structure (e.g., the hinge structure 164 of FIG. 3).

According to an embodiment, the first area 131a and the second area 131b may have a symmetrical shape as a whole with respect to the folding area 131c. In an embodiment, unlike the second area 131b, the first area 131a may include a notch area (e.g., a notch area 133 of FIG. 3) providing the sensor area 131d, and may have a shape symmetrical with that of the second area 131b in the remaining area. For example, the first area 131a and the second area 131b may include parts symmetrical to each other and parts asymmetrical to each other, in terms of shape. In an embodiment, the first area 131a may not be provided with the notch area (e.g., the notch area 133) providing the sensor area 131d, and may be symmetrical to the second area 131b in shape.

Figure 3:
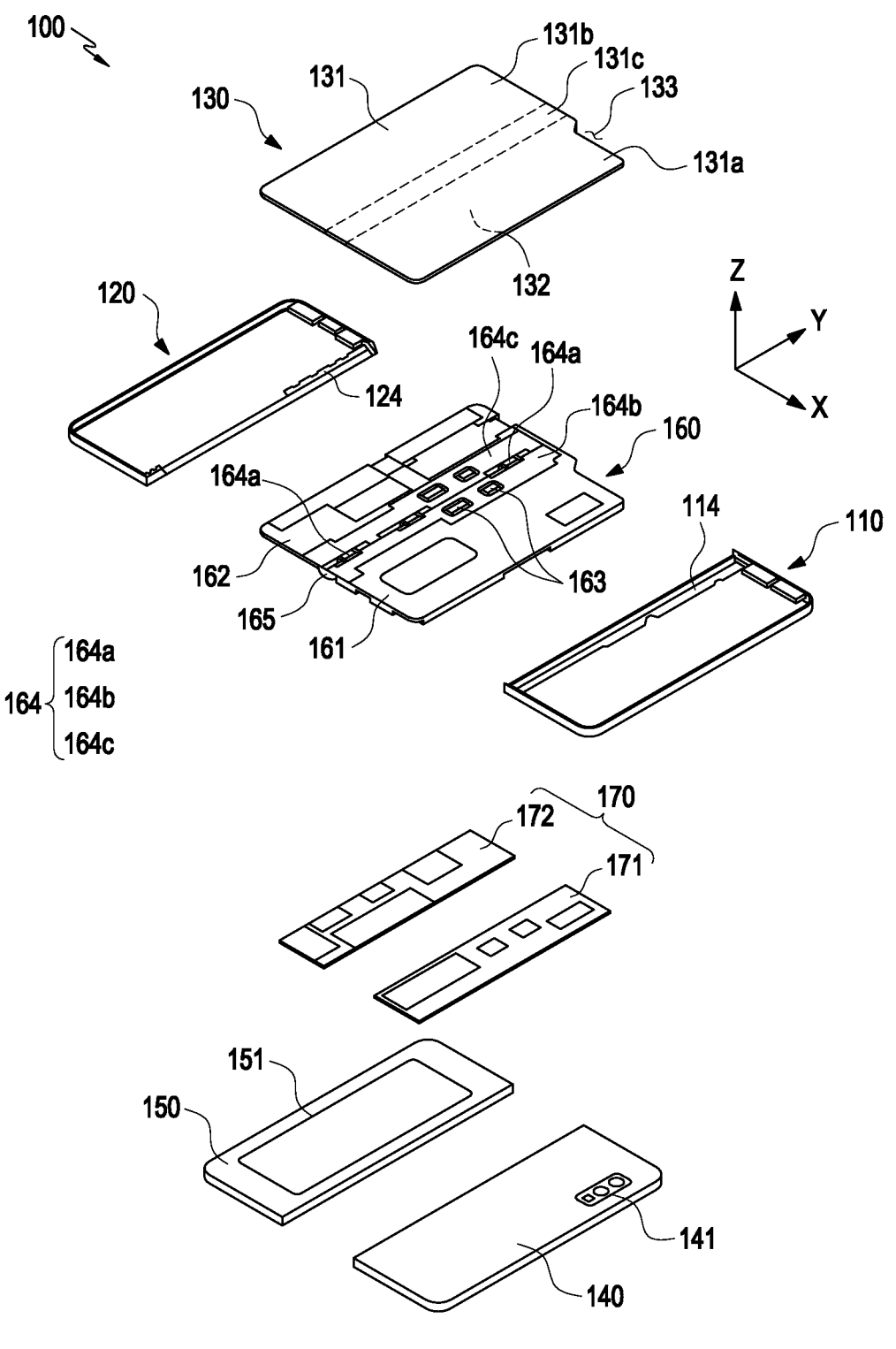
FIG. 3 is an exploded perspective view illustrating an electronic device according to an embodiment of the disclosure.

The hinge cover 165 may be disposed between the first housing structure 110 and the second housing structure 120 and configured to cover or at least partially cover an internal component (e.g., the hinge structure 164 of FIG. 3). In an embodiment, the hinge cover 165 may be covered or exposed outward by parts of the first housing structure 110 and the second housing structure 120 according to an operating state (the unfolded state or the folded state) of the electronic device 100.

Described below are operations of the first housing structure 110 and the second housing structure 120 and each area of the display 130 according to the operating states (e.g., the unfolded state and the folded state) of the electronic device 100.

In an embodiment, when the electronic device 100 is in the unfolded state (e.g., the state of FIG. 1), the first housing structure 110 and the second housing structure 120 may be at an angle of 180 degrees, and the first area 131a and the second area 131b of the display 130 may be disposed to face substantially the same direction to, for example, display screens in parallel directions. Further, the folding area 131c may form substantially the same plane with the first area 131a and the second area 131b.

In an embodiment, when the electronic device 100 is in the folded state (e.g., the state of FIG. 2), the first housing structure 110 and the second housing structure 120 may be disposed to face each other. For example, when the electronic device 100 is in the folded state (e.g., the state of FIG. 2), the first area 131a and the second area 131b of the display 130 may be at a narrow angle (e.g., between 0 and 10 degrees) and face each other. When the electronic device 100 is in the folded state (e.g., the state of FIG. 2), at least a part of the folding area 131c may form a curved surface with a specific curvature.

In an embodiment, when the electronic device 100 is in the intermediate state, the first housing structure 110 and the second housing structure 120 may form a particular angle, for example, about 90 degrees or about 120 degrees. However, the angle is not necessarily limited to these specific values. For example, in the intermediate state, the first area 131a and the second area 131b of the display 130 may form an angle larger than that in the folded state and smaller than that in the unfolded state. At least a part of the folding area 131c may have a curved surface with a specific curvature, which may be smaller than that in the folded state.

In the foregoing embodiments, an inward-folding electronic device is taken as an example, in which a first surface (e.g., the first surface 111 of FIG. 1) of a first housing 210 and a third surface (e.g., the third surface 121 of FIG. 1) of a second housing 220 face each other in the folded state of the electronic device 100, and the first surface (e.g., the first surface 111 of FIG. 1) of the first housing 210 and the third surface (e.g., the third surface 121 of FIG. 1) of the second housing 220 face substantially the same direction in the unfolded state.

The electronic device 100 according to various embodiments of the disclosure may include an outward-folding electronic device in which a second surface (e.g., the second surface 112 of FIG. 1) of the first housing 210 and a fourth surface (e.g., the fourth surface 122 of FIG. 1) of the second housing 220 face each other in the folded state, and the second surface (e.g., the second surface 112 of FIG. 1) of the first housing 210 and the fourth surface (e.g., the fourth surface 122 of FIG. 1) of the second housing 220 face substantially the same direction. Accordingly, the above description of the inward-folding electronic device may also be applicable to the outward-folding electronic device. Hereinafter, for ease of description, examples of various angles in the folded state, the unfolded state, and the intermediate state of the electronic device will be described in the context of the in-folding electronic device. However, these examples may be substantially equally applicable to the outward-folding electronic device. For example, components may substantially equally operate, when the first housing 210 and the second housing 220 form an angle of approximately 60 degrees to 150 degrees in the intermediate state of the in-folding electronic device and when the first housing 210 and the second housing 220 form an angle of approximately −60 degrees to −150 degrees in the intermediate state of the out-folding electronic device.

FIG. 3 is an exploded perspective view illustrating the electronic device 100 according to an embodiment of the disclosure.

Referring to FIG. 3, in an embodiment, the electronic device 100 may include the display 130, a support member assembly 160, at least one PCB 170, the first housing structure 110, the second housing structure 120, the first rear cover 140, and the second rear cover 150. Herein, the display 130 may be referred to as a display module or a display assembly.

The display 130 may include a display panel 131 (e.g., a flexible display panel) and at least one plate 132 or layer on which the display panel 131 is mounted. In an embodiment, the plate 132 may be disposed between the display panel 131 and the support member assembly 160. The display panel 131 may be disposed on at least a part of one surface (e.g., a surface in a Z-axis direction in FIG. 3) of the plate 132. The plate 132 may have a shape corresponding to the display panel 131. For example, a partial area of the plate 132 may be formed into a shape corresponding to the notch area 133 of the display panel 131.

The support member assembly 160 may include a first support member 161, a second support member 162, the hinge structure 164 disposed between the first support member 161 and the second support member 162, the hinge cover 165 which covers or at least partially covers the hinge structure 164 when the hinge structure 164 is viewed from the outside, and a wiring member 163 (e.g., a flexible printed circuit board (FPCB)) crossing the first and second support members 161 and 162.

In an embodiment, the support member assembly 160 may be disposed between the plate 132 and the at least one PCB 170. For example, the first support member 161 may be disposed between the first area 131a of the display 130 and a first PCB 171. The second support member 162 may be disposed between the second area 131b of the display 130 and a second PCB 172.

In an embodiment, the wiring member 163 or at least a part of the hinge structure 164 may be disposed inside the support member assembly 160. For example, the wiring member 163 may be disposed in a direction (e.g., an X-axis direction) crossing the first support member 161 and the second support member 162. In another example, the wiring member 163 may be disposed in the direction (e.g., the X-axis direction) perpendicular to the folding axis (e.g., the Y axis or the folding axis A of FIG. 1) of the folding area 131c.

According to various embodiments, the hinge structure 164 may include a hinge 164a, a first hinge plate 164b, and/or a second hinge plate 164c. In some embodiments, the hinge 164a may include the first hinge plate 164b and the second hinge plate 164c. In an embodiment, the first hinge plate 164b may be mounted inside the first housing structure 110, and the second hinge plate 164c may be mounted inside the second housing structure 120. In some embodiments, the first hinge plate 164b may be mounted directly on the first support member 161, and the second hinge plate 164c may be mounted directly on the second support member 162. In another embodiment, the first hinge plate 164b (or the second hinge plate 164c) may be mounted directly on another structure (e.g., a first rotation support surface 114 or a second rotation support surface 124) inside the first housing structure 110 (or the second housing structure 120). For example, the structure in which the first hinge plate 164b (or the second hinge plate 164c) is mounted inside the first housing structure 110 (or the second housing structure 120) may vary according to embodiments. In another embodiment, the hinge 164a may be mounted on the first hinge plate 164b and the second hinge plate 164c to rotatably couple the second hinge plate 164c to the first hinge plate 164b. For example, the folding axis (e.g., the folding axis A of FIG. 1) may be formed by the hinge 164a, and the first housing structure 110 and the second housing structure 120 (or the first support member 161 and the second support member 162) may rotate substantially around the folding axis A with respect to each other.

In an embodiment, the at least one PCB 170 may include the first PCB 171 disposed at the side of the first support member 161 and the second PCB disposed at the side of the second support member 162, as described above. The first PCB 171 and the second PCB 172 may be disposed inside a space formed by the support member assembly 160, the first housing structure 110, the second housing structure 120, the first rear cover 140, and the second rear cover 150. Components for executing various functions of the electronic device 100 may be arranged on the first PCB 171 and the second PCB 172.

In an embodiment, with the display 130 coupled with the support member assembly 160, the first housing structure 110 and the second housing structure 120 may be assembled to be coupled with both sides of the support member assembly 160. The first housing structure 110 and the second housing structure 120 may be slidably coupled with both sides of the support member assembly 160 (e.g., the first support member 161 and the second support member 162, respectively). The first support member 161 and the second support member 162 may be accommodated substantially in the first housing structure 110 and the second housing structure 120, and according to an embodiment, the first support member 161 and the second support member 162 may be parts of the first housing structure 110 and the second housing structure 120.

In an embodiment, the first housing structure 110 may include the first rotation support surface 114, and the second housing structure 120 may include the second rotation support surface 124 corresponding to the first rotation support surface 114. The first rotation support surface 114 and the second rotation support surface 124 may include curved surfaces corresponding to a curved surface included in the hinge cover 165.

In an embodiment, when the electronic device 100 is in the unfolded state (e.g., the state of FIG. 1), the first rotation support surface 114 and the second rotation support surface 124 may cover or at least partially cover the hinge cover 165 such that the hinge cover 165 may not be exposed or may be minimally exposed from the rear surface of the electronic device 100. In an embodiment, when the electronic device 100 is in the folded state (e.g., the state of FIG. 2), the first rotation support surface 114 and the second rotation support surface 124 may rotate along the curved surface included in the hinge cover 165 to maximize exposure of the hinge cover 165 from the rear surface of the electronic device 100.

In the above description, ordinal numbers such as first and second in the first housing structure 110, the second housing structure 120, the first side member 113, and the second side member 123 are used simply to distinguish components from each other, and it should be noted that the ordinal numbers do not limit the disclosure. For example, although the sensor area 131d has been described as formed in the first housing structure 110 by way of example, the sensor area 131d may be formed in the second housing structure 120 or the first and second housing structures 110 and 120. In another embodiment, although it has been described that the first rear area 141 is disposed on the first rear cover 140 and the sub-display 152 is disposed on the second rear cover 150 by way of example, both the first rear area 141 for arranging sensors therein and the sub-display 152 for outputting a screen may be disposed on either the first rear cover 140 or the second rear cover 150.

Figure 4:
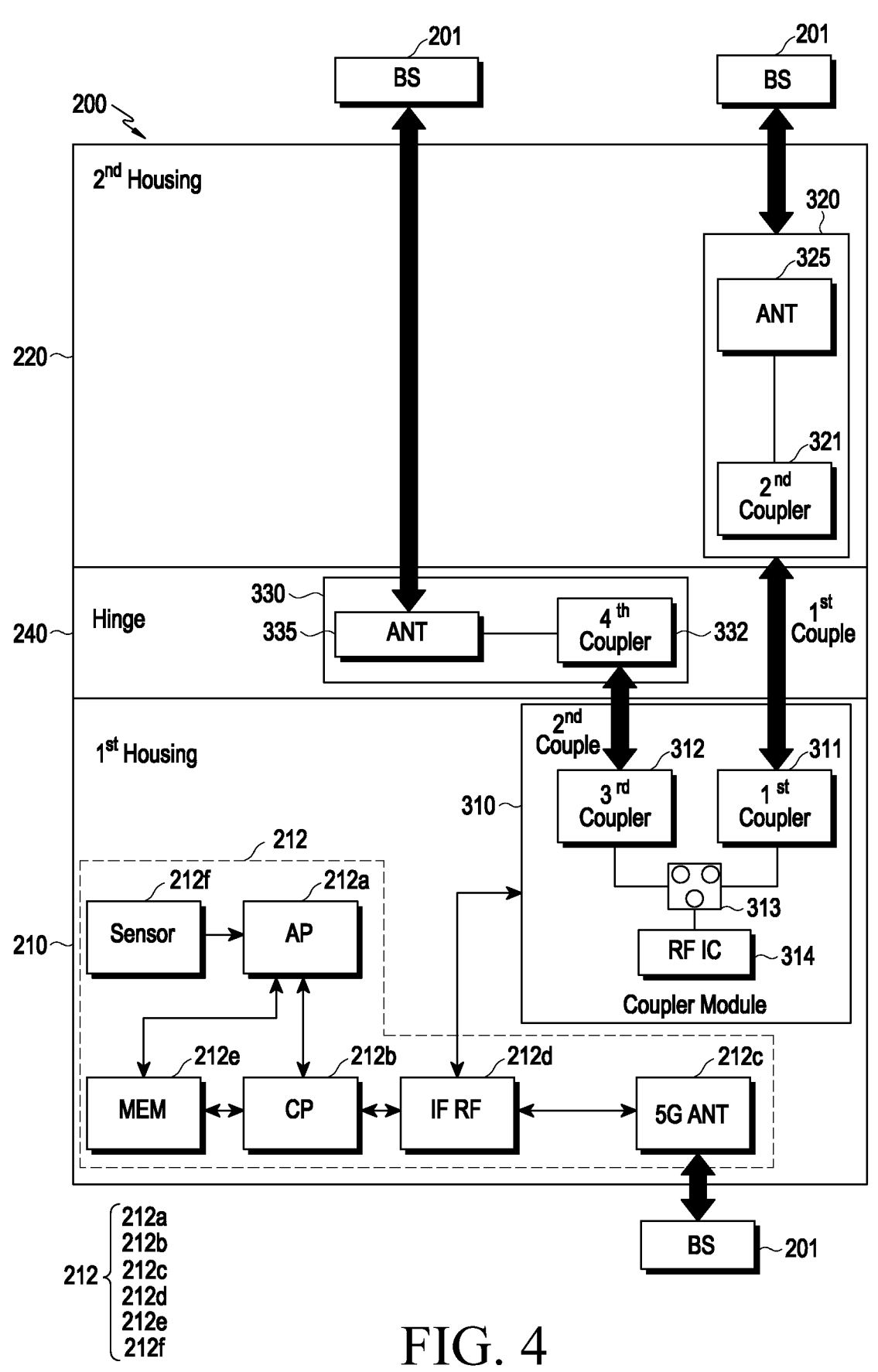
FIG. 4 is a block diagram illustrating a foldable electronic device according to an embodiment of the disclosure.
Figure 5:
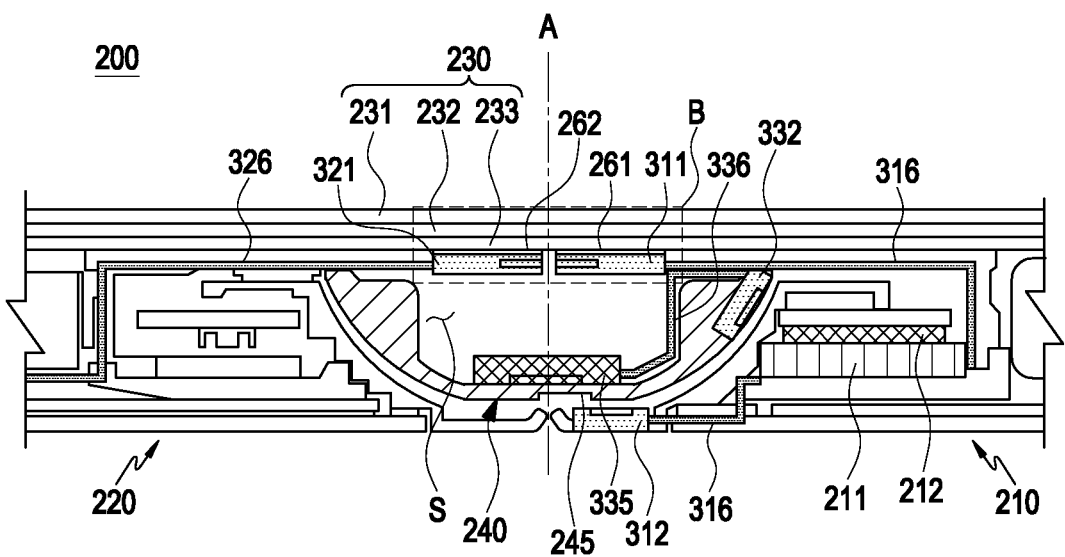
FIG. 5 is a cross-sectional view illustrating a foldable electronic device according to an embodiment of the disclosure.
Figure 6:
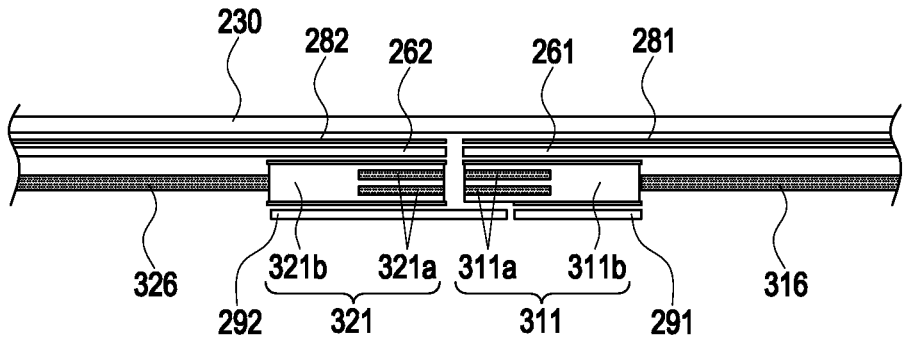
FIG. 6 is a cross-sectional view illustrating a first coupler and a second coupler in a foldable electronic device according to an embodiment of the disclosure.
Figure 7:
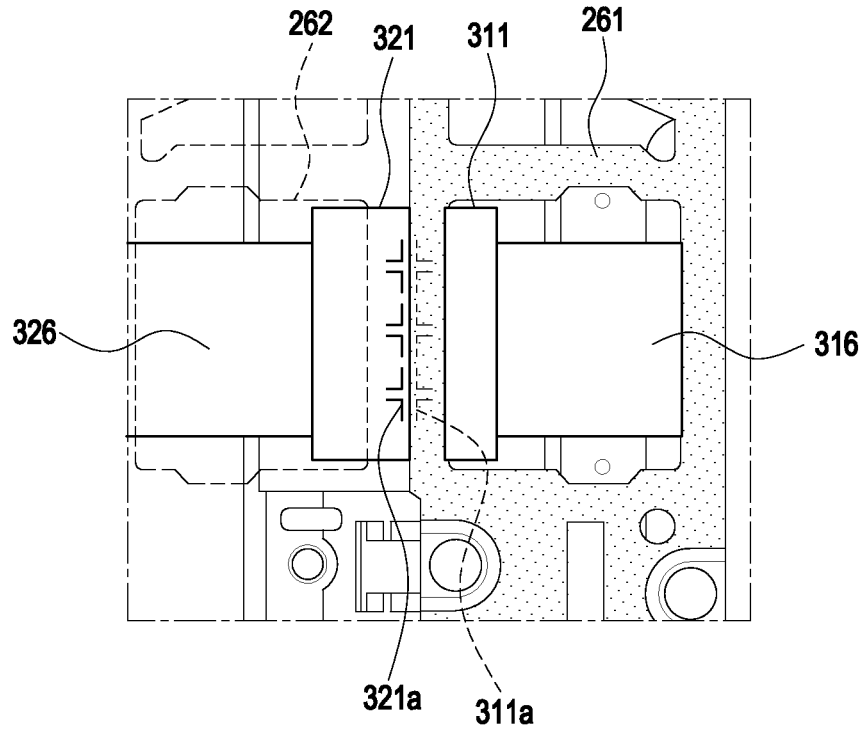
FIG. 7 is a front view illustrating a first coupler and a second coupler in a foldable electronic device according to an embodiment of the disclosure.

FIG. 4 is a block diagram illustrating a foldable electronic device 200 according to an embodiment of the disclosure. FIG. 5 is a cross-sectional view illustrating the foldable electronic device 200 according to an embodiment of the disclosure. FIG. 6 is a cross-sectional view illustrating a first coupler 311 and a second coupler 321 in the foldable electronic device 200 according to an embodiment of the disclosure. FIG. 7 is a front view illustrating the first coupler 311 and the second coupler 321 in the foldable electronic device 200 according to an embodiment of the disclosure. FIGS. 6 and 7 are enlarged views of an area B in FIG. 5.

Referring to FIGS. 4 and 5, the foldable electronic device 200 (e.g., the foldable electronic device 200 of FIG. 1) according to various embodiments of the disclosure may include a first housing 210 (e.g., the first housing structure 110 of FIGS. 1 to 3), a second housing 220 (e.g., the second housing structure 120 of FIGS. 1 to 3), a display 230 (e.g., the display 130 of FIG. 1 and/or FIG. 3), a hinge 240, and/or a hinge cover 245 (e.g., the hinge cover 165 of FIG. 2 and FIG. 3). The hinge cover 245 may be substantially concealed by the first housing 210 and the second housing 220 in the unfolded state of the foldable electronic device 200 and at least partially exposed to an external space between the first housing 210 and the second housing 220 in the folded state of the electronic device 200. The hinge 240 may be disposed or mounted inside (e.g., on the inner surface of) the hinge cover 245 and connect the first housing 210 to the second housing 220. In an embodiment, the hinge 240 may provide a folding axis A (e.g., the folding axis A in FIG. 1), and according to an embodiment, provide a rotational axis around which the first housing 210 rotates and a rotational axis around which the second housing 220 rotates.

According to various embodiments, the hinge 240 and/or the hinge cover 245 may be located substantially in correspondence to a folding area (e.g., the folding area 131c of FIG. 1) of the display 230, and the first housing 210 and the second housing 220 may be coupled with the hinge 240 and rotate with respect to the hinge 240. The first housing 210 and the second housing 220 may rotate between a position at which they face each other (e.g., the folded state in FIG. 2) and a position at which they are unfolded at a predetermined angle with respect to each other (e.g., the unfolded state in FIG. 1). In an embodiment, a position at which the first housing 210 and the second housing 220 are unfolded at a predetermined angle may include a position at which the first housing 210 and the second housing 220 are unfolded at an angle of 180 degrees with respect to each other. When either of the first housing 210 and the second housing 220 rotates, the hinge 240 may rotate the other of the first housing 210 and the second housing 220. For example, when the first housing 210 rotates in a direction that increases the angle that the first housing 210 forms with the second housing 220, the hinge 240 may rotate the second housing 220 in a direction in which the second housing 220 is unfolded with respect to the first housing 210. In some embodiments, when the first housing 210 and the second housing 220 rotate between the position where they face each other and the position where they form an angle of about 180 degrees with respect to each other, the first housing 210 may rotate at an angle of about 90 degrees with respect to the hinge 240, and the second housing 220 may rotate at an angle of about 90 degrees with respect to the hinge 240. According to various embodiments, the foldable electronic device 200 may include the flexible display 230 disposed to extend from one surface of the first housing 210, across an area where the hinge 240 is disposed, to one surface of the second housing 220. The flexible display 230 may be exposed, for example, through a substantial portion of the front face of the foldable electronic device 200. The flexible display 230 may include a display panel 232 including a plurality of pixels for displaying a screen and a window glass 231 to protect the display panel 232 from external physical/chemical impacts. The window glass 231 may be stacked on one surface of the display panel 232 and exposed to the outside of the housings. In an embodiment, the display panel 232 of the flexible display 230 may be coupled with or disposed adjacent to a touch sensing circuit, a pressure sensor capable of measuring the intensity (pressure) of a touch, and/or a digitizer capable of detecting a magnetic stylus pen. The display panel 232 may be, for example, a panel such as an LCD, LED, or AMOLED, and display various images based on various operation states of the electronic device 100, application execution, and content.

According to various embodiments, the flexible display 230 may further include a touch panel 233, a magnetic shielding member, and/or a protective member on the rear surface of the display panel 232.

Various types of touch panels may be implemented as the touch panel 233. For example, various types of touch panels may be used, such as a capacitive touch panel that senses a change in capacitance, a pressure touch panel that detects a position by sensing pressure applied on the panel, an optical touch panel using infrared (IR) light, and a transparent electrode touch panel using a contact point on a transparent conductive film. In addition, various other types of input position detecting panels which have not been mentioned may be used, such as an electromagnetic resonance (EMR) touch panel. According to an embodiment, the touch panel 233 may be formed to have substantially the same area as the display panel 232 and attached to the display panel 232. For example, when a digitizer panel is used as the touch panel 233, the digitizer panel may include a pattern layer having a transmission pattern (e.g., a Tx pattern) formed thereon and a pattern layer having a reception pattern (e.g., an Rx pattern) formed thereon, and the transmission pattern layer and the reception pattern layer may be mutually stacked to generate/detect an electromagnetic field. According to an embodiment, the digitizer panel may be used to detect a magnetic field generated from an electromagnetic inductor (an input device, for example, a stylus pen) by an EMR scheme and detect various motions such as approaching, clicking, or dragging of the electromagnetic inductor.

According to various embodiments, the flexible display 230 may further include the magnetic shielding member and/or the protective member on the rear surface of the touch panel 233. According to an embodiment, the magnetic shielding member may be disposed on the rear surface of the touch panel 233. The magnetic shielding member may be, for example, magnetic metal powder (MMP) coated on the rear surface of the touch panel 233. The magnetic shielding member may shield magnetic forces perceived as noise other than a signal input from the stylus pen from surrounding electronic components.

According to an embodiment, the protective member may be further disposed on the rear surface of the touch panel 233. The protective member may be formed of, for example, any one of at least one adhesive layer, at least one cushioning layer, and at least one heat dissipation layer, or a combination of at least two of the at least one adhesive layer, the at least one cushioning layer, and the at least one heat dissipation layer. The at least one cushioning layer may be a component that may have an embo pattern formed thereon and thus absorb physical impacts applied on the panel. The at least one heat dissipation layer may be a component for dissipating heat generated from the display panel 232 and/or the touch panel 233 to the outside, which may at least partially include, for example, a metallic material (e.g., graphite or copper (Cu) foil).

According to various embodiments, the flexible display 230 may be supported by at least a part of the hinge 240 (e.g., hinge plates 261 and 262) in the folding area (e.g., the folding area 131c of FIG. 3). The hinge plates 261 and 262 may be disposed in a longitudinal direction of the foldable electronic device 200 (e.g., parallel to the folding axis A). For example, when the foldable electronic device 200 is folded or unfolded, the hinge plates 261 and 262 may support at least a part of the folding area (e.g., the folding area 131c of FIG. 1), while being deformed in correspondence to the folding area (e.g., the folding area 131c of FIG. 1) of the flexible display 230. In the unfolded state of the electronic device 200, when an external object or a user touches the folding area (e.g., the folding area 131c of FIG. 1), the hinge plates 261 and 262 may support the folding area (e.g., the folding area 131c of FIG. 1) and thus suppress deformation of the folding area (e.g., the folding area 131c of FIG. 1).

According to various embodiments, the foldable electronic device 200 may include a substrate 211 and at least one component 212 disposed on the substrate 211. For example, the foldable electronic device 200 may include, as components 212, a first component disposed in the first housing 210 and a second component disposed in the second housing 220. According to an embodiment, the first component 212 may include a plurality of components, for example, a processor and/or an antenna 212c (e.g., a 5$^{th}$ generation antenna (5G ANT)). According to another embodiment, the first component 212 may further include a transceiver 212d (e.g., an intermediate frequency (IF) radio frequency (RF) transceiver), memory 212e, and/or a sensor 212f.

The processor may, for example, control at least one other component (e.g., hardware or software components) connected to the processor in the electronic device and perform various data processes or computations by executing software (e.g., a program). According to an embodiment, as at least some of the data processes or computations, the processor may load instructions or data received from another component (e.g., a sensor module or a communication module) into volatile memory, process the instructions or data stored in the volatile memory, and store the resulting data in non-volatile memory. According to an embodiment, the processor may include a main processor (e.g., a central processing unit (CPU) or an application processor (AP) 212a), and an auxiliary processor (e.g., a graphics processing unit (GPU), an image signal processor, a sensor hub processor, or a communication processor (CP) 212b) that may operate independently or in conjunction with the main processor. Additionally or alternatively, the auxiliary processor may be configured to use lower power than the main processor or to be specialized for a predetermined function. In an embodiment, the auxiliary processor may be implemented separately from or as a part of the main processor. According to an embodiment, the auxiliary processor may include a touch integrated circuit (IC). The touch IC is a processor connected to the touch panel, which may operate dependently on an operation performed by the processor or perform a predetermined function independently.

Figure 10:
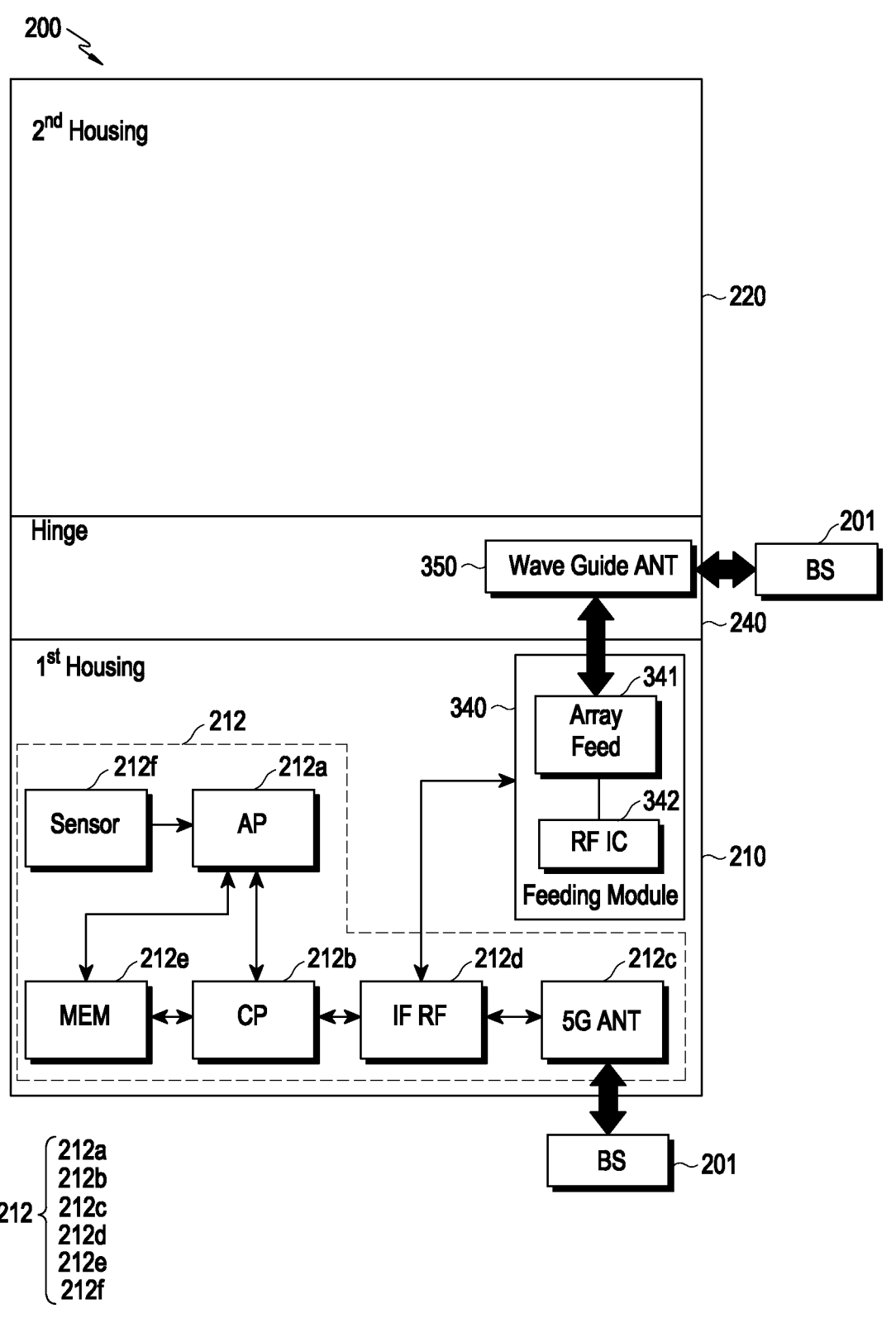
FIG. 10 is a block diagram illustrating a foldable electronic device according to an embodiment of the disclosure.
Figure 13:
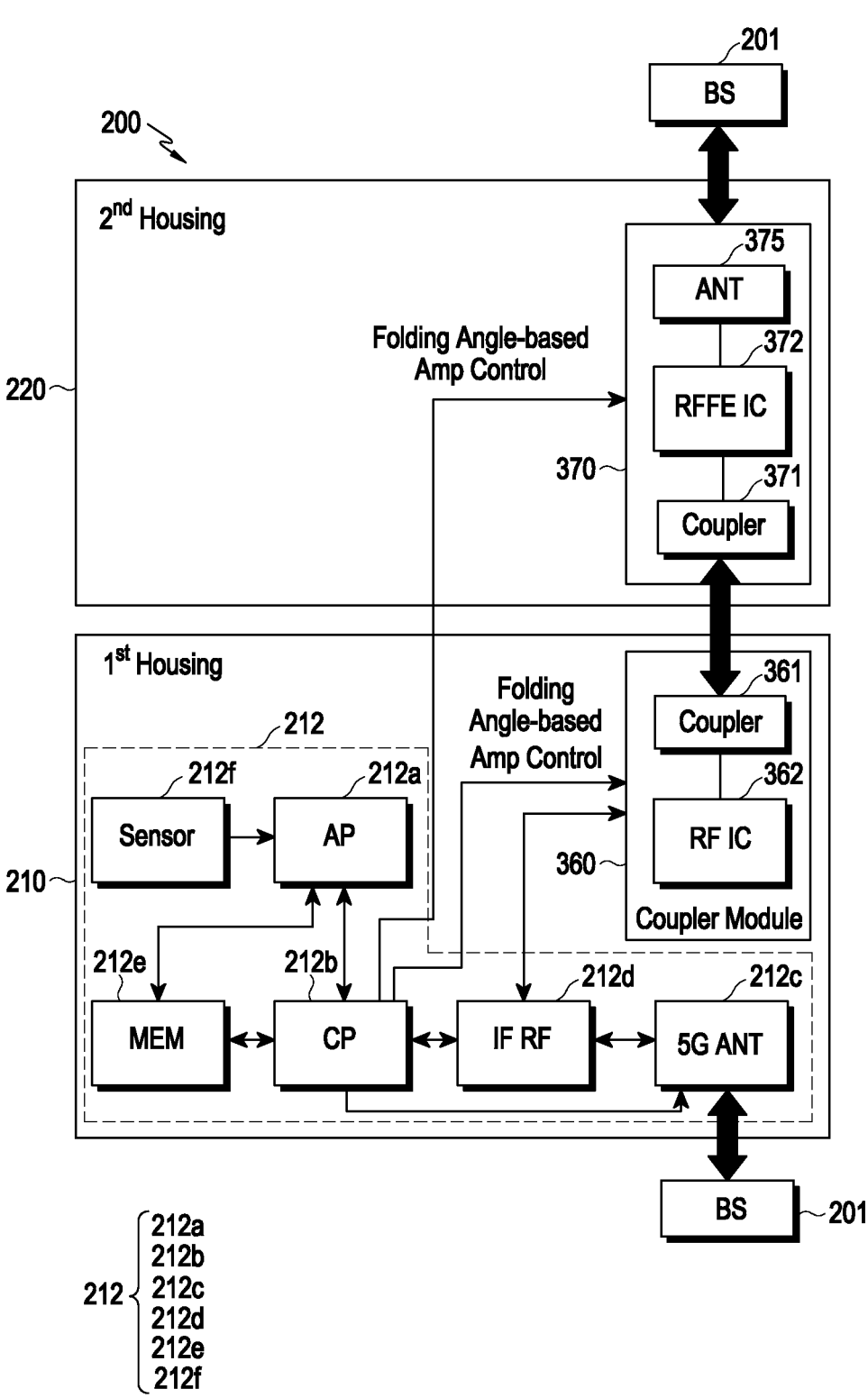
FIG. 13 is a block diagram illustrating a foldable electronic device according to an embodiment of the disclosure.

In the embodiments of FIGS. 4, 10, and 13, the CP 212b as an auxiliary processor is shown as a component separate from the AP 212a as the main processor, to which the disclosure is not necessarily limited. The CP 212b may also be integrated into the AP 212a as a single processor. According to an embodiment, the transceiver 212d (e.g., the IF RF transceiver) for changing an IF (e.g., about 10 GHz) to an RF or vice versa may also be integrated into the AP 212a.

The memory (MEM) 212e may store various data used by at least one component (e.g., the processor) of the electronic device 100. The data may include, for example, input data or output data for software (e.g., a program) and instructions related to the software. The memory 212e may include volatile memory or non-volatile memory.

The antenna 212c (e.g., 5G ANT) may transmit a signal or power to or receive a signal or power from the outside (e.g., an external electronic device). According to an embodiment, the antenna may include at least one antenna including a conductor formed on a substrate (e.g., a PCB) or a radiator (or an antenna element) formed of a conductive pattern. According to an embodiment, the antenna 212c may include a plurality of antennas. A signal or power may be transmitted or received between a communication module and an external electronic device (e.g., a base station (BS)) through at least one selected antenna. According to a certain embodiment, other components (e.g., an RF integrated circuit (RFIC)) may be further formed as a part of the antenna 212c, in addition to the radiator (or the antenna element). According to various embodiments of the disclosure, the antenna 212c may use the foldable electronic device 200 to cover a wide range of frequency bands from baseband to millimeter wave communication. For example, the antenna 212c may be a 5G antenna including a circuit for controlling an IF signal in a band below/above 10 GHz as well as an RF signal in a high-frequency mmWave band such as 28 GHz, 39 GHz, or 60 GHz. The foldable electronic device 200 may transmit a signal or power to an external electronic device (e.g., a BS) using the antenna 212c.

The sensor 212f may detect an operation state (e.g., power or temperature) of the electronic device 200 or an external environmental state (e.g., a user state), and generate an electrical signal or data value corresponding to the detected state. According to an embodiment, the sensor 212f may include, for example, a gesture sensor, a gyro sensor, a barometric pressure sensor, a magnetic sensor, an acceleration sensor, a grip sensor, a proximity sensor, a color sensor, an IR sensor, a biometric sensor, a temperature sensor, a humidity sensor, or an illuminance sensor. According to various embodiments of the disclosure, the sensor 212f may be used to identify whether the electronic device 200 is mounted on the ground, the angle between the first housing 210 and the second housing 220, whether the user's fingers have gripped the electronic device 200, and so on.

According to various embodiments of the disclosure, the first component 212 as a component disposed in the first housing 210 may include at least one first antenna and/or a processor, as described before. Further, the second component as a component disposed in the second housing 220 may include at least one second antenna. The at least one first antenna disposed in the first housing 210 may correspond to the afore-described antenna 212c (e.g., 5G ANT) (hereinafter, collectively referred to as the "first antenna 212c"). For example, the first antenna 212c may include a radiator (or antenna element) formed of a conductor or conductive pattern, and another component (e.g., an RFIC) may be formed as a part of the first antenna 212c, in addition to the radiator. In another example, the first antenna 212c may be a 5G antenna that supports establishment of a communication channel corresponding to a predetermined band (e.g., from about 6 GHz to about 60 GHz) among bands to be used for far-field wireless communication, and 5G network communication through the established communication channel. Similarly to the first antenna 212c, a second antenna 325 may also include a radiator (or antenna element) formed of a conductor or conductive pattern, and another component (e.g., an RFIC) may be further formed as a part of the second antenna 325, in addition to the radiator. According to an embodiment, the second antenna 325 may be an array antenna with a plurality of radiators (or antenna elements) arranged in one direction.

According to various embodiments of the disclosure, the foldable electronic device 200 may further include a coupler for transmitting signals between components. According to an embodiment, the foldable electronic device 200 may include, as the coupler, the first coupler 311 disposed in the first housing 210 and electrically connected to the first component 212. The foldable electronic device 200 may further include the second coupler 321 which is electrically connected to the second component disposed in the second housing 220, and which, in a first state of the foldable electronic device 200, is disposed at a position corresponding to the first coupler 311 and transmits or receives a signal to or from the first coupler 311 by coupling to the first coupler 311. The first state of the electronic device may refer to the unfolded state of the electronic device, as illustrated in FIG. 5. According to various embodiments, the first coupler 311 and the second coupler 321 may transmit or receive signals in the mmWave band.

According to various embodiments of the disclosure, the foldable electronic device 200 may perform communication with an external electronic device (e.g., a BS 201) using the second antenna 325 by signal coupling (e.g., 1$^{st}$ couple) between the first coupler 311 and the second coupler 321 as well as using the first antenna 212c.

According to various embodiments, the hinge 240 may include at least one third antenna 335. The third antenna 335 may include a radiator (or antenna element) formed of a conductor or conductive pattern, and another component (e.g., an RFIC) may be further formed as a part of the third antenna 335, in addition to the radiator. According to an embodiment, the third antenna 335 may be an array antenna with a plurality of radiators (or antenna elements) arranged in one direction.

According to various embodiments of the disclosure, the foldable electronic device 200 may further include a third coupler 312 and a fourth coupler 332. The third coupler 312 may be disposed in the first housing 210 and electrically connected to the first component 212. For example, the third coupler 312 may be electrically connected to the transceiver 212d (e.g., the IF RF transceiver). The fourth coupler 332 may be disposed in the hinge 240 and electrically connected with the third antenna 335. In a second state of the electronic device, the fourth coupler 332 may be disposed at a position corresponding to the third coupler 312 and transmit or receive a signal through the third coupler 312 by coupling to the third coupler 312. The second state of the electronic device may refer to the electronic device having a predetermined angular range between the first housing 210 and the second housing 220 in the folded state or the unfolded state.

According to various embodiments, the third coupler 312 and the fourth coupler 332 as well as the first coupler 311 and the second coupler 321 may be transmit or receive a signal in the mmWave band. The foldable electronic device 200 may perform communication with an external electronic device (e.g., the BS 201) using the third antenna 335 by signal coupling (e.g., 2$^{nd}$ couple) between the third coupler 312 and the fourth coupler 332 as well as using the first antenna 212c.

According to various embodiments, the first coupler 311 and the third coupler 312 together with other components (e.g., a switch 313 and an RFIC 314) may be formed in the form of a coupler module 310 and disposed in the first housing 210. In another example, the second coupler 321 and the second antenna 325 may also be formed in the form of a coupler module 320 and disposed in the second housing 220. In another example, the third coupler 312 and the third antenna 335 may also be formed in the form of a single module 330 and disposed in the hinge 240.

Referring to FIGS. 5, 6, and 7 together, in an embodiment, the first coupler 311 and the second coupler 321 may be disposed adjacent to the rear surface of the flexible display 230 in the folding area (e.g., the folding area 131c in FIG. 3) on the hinge 240.

According to an embodiment, the first coupler 311 may extend from the first housing 210, the second coupler 321 may extend from the second housing 220, and each of the first coupler 311 and the second coupler 321 may include a rigid portion and a flexible portion. According to an embodiment, the first coupler 311 and the second coupler 321 may be formed in a rigid portion of the PCB.

According to various embodiments, a signal line 316 electrically connecting the first coupler 311 to the first component and a signal line 326 electrically connecting the second coupler 321 to the second component may be implemented as an FPCB, an FPCB-type RF cable (FRC), and/or a cable.

According to various embodiments, the first coupler 311 may include a first dielectric 311b and a first conductor 311a formed to be at least partially surrounded by the first dielectric 311b. In another example, the second coupler 321 may include a second dielectric 321b and a second conductor 321a formed to be at least partially surrounded by the second dielectric 321b. According to an embodiment, the first conductor 311a or the second conductor 321a may be formed in the form of a dipole, and implemented to be surrounded by at least one ground 281, 282, 291, and 292.

According to an embodiment, the number of first conductors 311a or second conductors 321a may be determined based on the number of antennas included in the second antenna 325 or the third antenna 335. For example, the number of first conductors 311*a* or second conductors 321*a* may be equal to the number of antennas included in the second antenna 325 or the third antenna 335. In another example, the number of first conductors 311*a* or second conductors 321*a* may be equal to the number of antennas to be fed in the second antenna 325 or the third antenna 335.

The embodiments of FIGS. 5 through 7 may depict the first state of the electronic device, such as the unfolded state of the foldable electronic device 200. In the unfolded state of the foldable electronic device 200, the first coupler 311 and the second coupler 321 may be located to enable coupling between them, such that a signal is transmitted and received in the mmWave band. For example, the unfolded state of the foldable electronic device 200, which enables signal coupling between the first coupler 311 and the second coupler 321, may include not only a fully unfolded state in which one surface (e.g., a first surface) of the first housing 210 and one surface (e.g., a third surface) of the second housing 220 face the same direction, but also a state in which the first housing 210 and the second housing 220 have a first predetermined angular range. For example, even when the first housing 210 and the second housing 220 have a range of approximately more than 150 degrees and less than 180 degrees, coupling between the first coupler 311 and the second coupler 321 is possible, which enables signal coupling. In another example, in the second state of the foldable electronic device 200, for example, when the foldable electronic device 200 and the second housing 220 have a second predetermined angular range therebetween in the folded state or unfolded state of the foldable electronic device 200, signal coupling may not occur between the first coupler 311 and the second coupler 321. For example, when the first housing 210 and the second housing 220 are at an angle more than 0 degrees and less than 150 degrees, signal coupling may not be performed between the first coupler 311 and the second coupler 321. For example, when the first housing 210 and the second housing 220 are at an angle more than 0 degrees and less than 150 degrees, the first coupler 311 and the second coupler 321 may not be coupled to each other.

According to an embodiment, the coupler module 310 may include the first coupler 311, the third coupler 312, the RFIC 314, or the switch 313. The coupler module 310 may be electrically connected to the IF RF transceiver 212*d*.

According to an embodiment, the switch 313 may electrically connect at least one of the first coupler 311 or the third coupler 312 to the RFIC 314 based on an angle between the first housing 210 and the second housing 220 of the foldable electronic device 200.

For example, when the foldable electronic device 200 is in the unfolded state (e.g., when the angle between the first housing 210 and the second housing 220 is about 150 degrees to about 180 degrees), the first coupler 311 and the second coupler 321 may be located to enable coupling, and the switch 313 may electrically connect the RFIC 314 to the first coupler 311. Accordingly, the foldable electronic device 200 may perform communication using the second antenna 325.

In another example, when the foldable electronic device 200 is in the intermediate state, for example, when the angle between the first housing 210 and the second housing 220 is between about 90 degrees and about 150 degrees, the third coupler 312 may be located to enable coupling to the fourth coupler 332, and the switch 313 may electrically connect the RFIC 314 to the third coupler 312. Accordingly, the foldable electronic device 200 may perform communication using the third antenna 335.

According to an embodiment, the RFIC 314 may convert an IF signal received from the transceiver 212*d* (e.g., the IF RF transceiver) into an RF signal. In an embodiment, when the RFIC 314 is omitted, the second antenna 325 and the third antenna 335 may include an RFIC (e.g., the RFIC 314).

Figure 8:
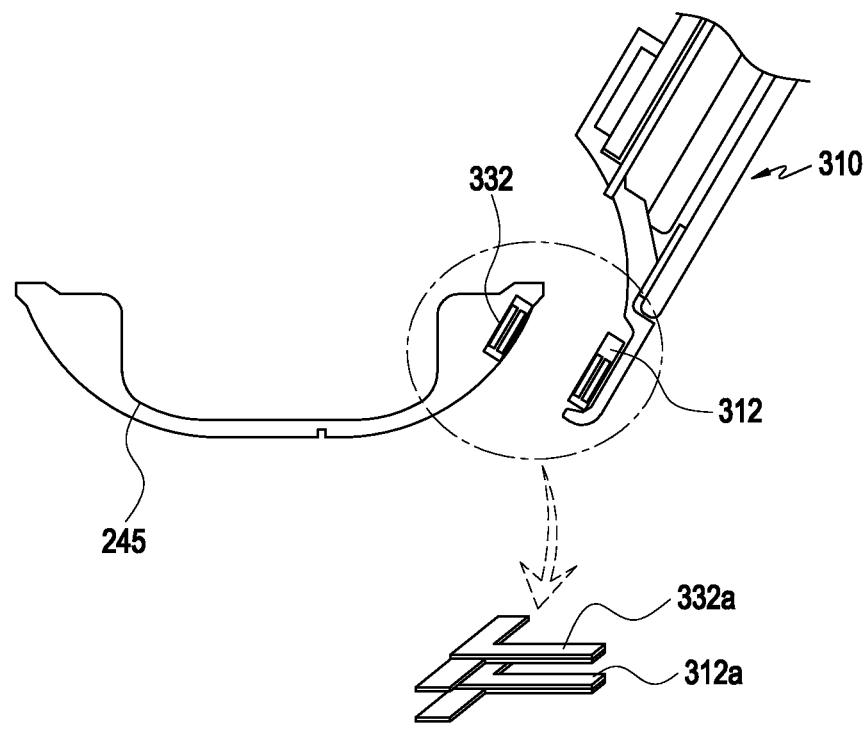
FIG. 8 is a cross-sectional view illustrating a third coupler and a fourth coupler in a foldable electronic device according to an embodiment of the disclosure.
Figure 9:
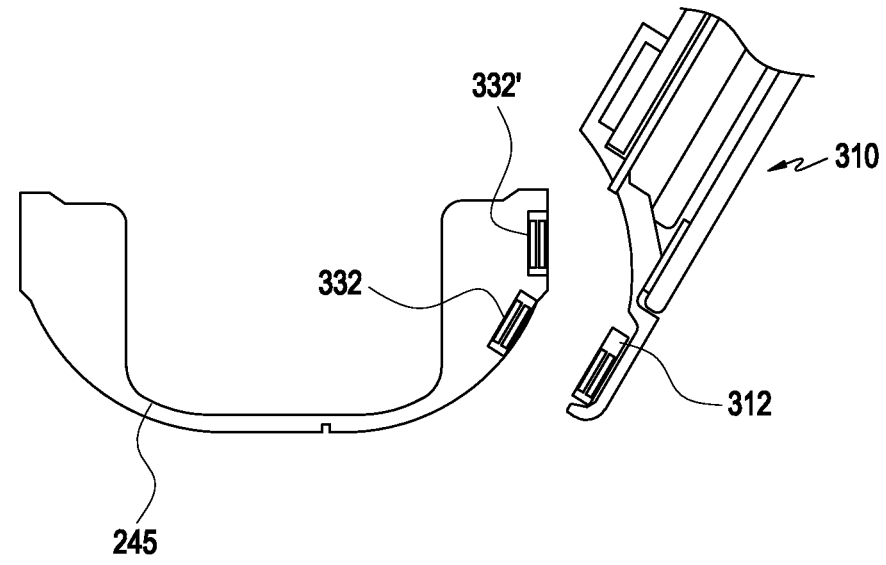
FIG. 9 is a cross-sectional view illustrating a foldable electronic device including a plurality of couplers according to an embodiment of the disclosure.

FIG. 8 is a cross-sectional view illustrating the third coupler 312 and the fourth coupler 332 in the foldable electronic device according to an embodiment of the disclosure. FIG. 9 is a cross-sectional view illustrating the foldable electronic device including the fourth coupler 332 and a fifth coupler 332' according to an embodiment of the disclosure.

Referring to FIG. 8 in conjunction with FIG. 5, the third coupler 312 is provided on one side of the first housing 210, and the fourth coupler 332 is provided on one side of the hinge cover 245.

Referring again to FIG. 5, in the first state of the foldable electronic device 200 (e.g., in the unfolded state of the foldable electronic device 200), the third coupler 312 and the fourth coupler 332 may be located such that they are not coupled to each other. For example, when the foldable electronic device 200 is fully unfolded, the third coupler 312, which is formed on an edge of the first housing 210, may be located to face the same direction as the direction in which the first surface of the first housing 210 faces, and the fourth coupler 332, which is formed on an edge of the hinge cover 245, may be located to face a direction inclined to the direction in which the first surface (e.g., the first surface 111 of FIG. 1) of the first housing 210 faces. In this state, signal coupling may be impossible or impractical between the third coupler 312 and the fourth coupler 332. For example, the third coupler 312 and the fourth coupler 332 may be located at positions that do not enable coupling between them.

In another example, referring to the embodiments of FIGS. 8 and 9, the second state of the foldable electronic device 200 may indicate, for example, that the electronic device has a second predetermined angle in the folded state or intermediate state. The second predetermined angle may be, for example, an angle greater than 0 degrees and less than 150 degrees between the first housing 210 and the second housing 220. In this case, the third coupler 312 and the fourth coupler 332 may be aligned to face each other and coupled to each other. For example, the third coupler 312 and the fourth coupler 332 may form a state in which signal coupling is possible between them in a certain angular range. For example, the third coupler 312 may include a third conductor 312*a* (e.g., a conductor in the form of a dipole or a patch), and the fourth coupler 332 may include a fourth conductor 332*a* (e.g., a conductor in the form of a dipole or a patch). When the third conductor 312*a* and the fourth conductor 332*a* at least partially overlap each other, signal coupling may be possible. For example, when the third conductor 312*a* and the fourth conductor 332*a* are coupled to each other, signal coupling may be possible.

As such, the first coupler 311 and the second coupler 321 may form the first signal coupling based on the folding angle between the first housing 210 and the second housing 220. In another example, the third coupler 312 and the fourth coupler 332 may form the second signal coupling distinct from the first signal coupling according to the folding angle between the first housing 210 and the second housing 220.

According to various embodiments, the foldable electronic device 200 may further include at least one other coupler in addition to the couplers described above (e.g., the first coupler 311, the second coupler 321, the third coupler 312, and the fourth coupler 332). For example, the fifth coupler 332' may be further disposed on the hinge cover 245 as illustrated in FIG. 9. The fifth coupler 332' may be connected to the third antenna 335, although it is not shown separately in FIG. 5. An angle formed between the first housing 210 and the second housing 220 when the fourth coupler 332 and the third coupler 312 are coupled to each other may be different from an angle formed between the first housing 210 and the second housing 220 when the fifth coupler 332' and the third coupler 312 are coupled. Accordingly, the third antenna may receive a signal in a wider angular range formed by the first housing 210 and the second housing 220.

According to other embodiments of the disclosure, the foldable electronic device 200 may implement the first signal coupling and the second signal coupling according to the folding angle between the first housing 210 and the second housing, using the first coupler 311, the second coupler 321, and the fourth coupler 332. For example, when the foldable electronic device 200 is in the unfolded state, the first coupler 311 and the second coupler 321 may be coupled to form the first signal coupling, and when the foldable electronic device 200 has the second predetermined angle in the folded state or intermediate state, the first coupler 311 and the fourth coupler 332 may be coupled to form the second signal coupling.

Figure 11:
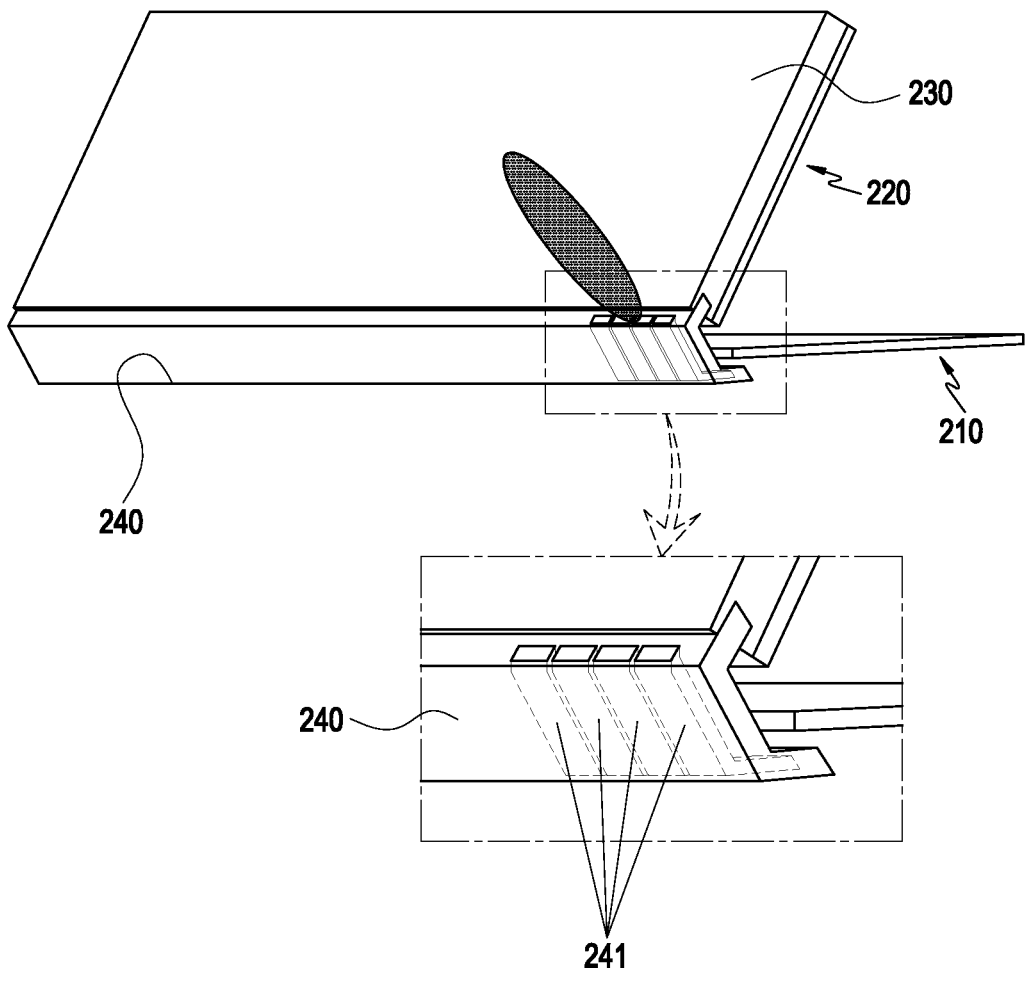
FIG. 11 is a perspective view illustrating a waveguide in a foldable electronic device according to an embodiment of the disclosure.
Figure 12:
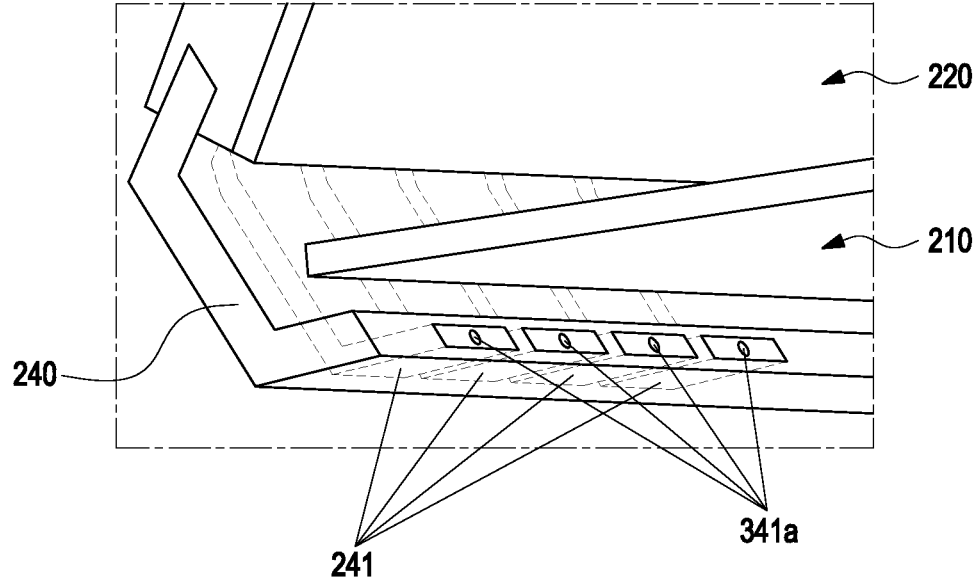
FIG. 12 is a perspective view illustrating a waveguide and a feeder in a foldable electronic device according to an embodiment of the disclosure.

FIG. 10 is a block diagram illustrating the foldable electronic device 200 according to an embodiment of the disclosure. FIG. 11 is a perspective view illustrating a waveguide 241 in the foldable electronic device 200 according to an embodiment of the disclosure. FIG. 12 is a perspective view illustrating the waveguide 241 and a feeder 341a in the foldable electronic device 200 according to an embodiment of the disclosure.

Referring now to FIGS. 10 to 12, the foldable electronic device 200 may include a waveguide antenna 350 according to various embodiments of the disclosure. According to an embodiment, the waveguide antenna 350 may include the waveguide 241 formed from one side of the hinge 240 to the other side thereof, and an antenna 341 including the feeder 341a that feeds through one side of the waveguide 241.

Referring to FIGS. 11 and 12, the foldable electronic device 200 may include the first housing 210, the second housing 220, the hinge 240 rotatably connecting the first housing 210 and the second housing 220, and the flexible display 230 disposed to extend from one surface of the first housing 210, across the area where the hinge is disposed, to one surface of the second housing 220. While FIGS. 11 and 12 may illustrate an embodiment in which the foldable electronic device 200 is an outward-folding electronic device, embodiments may include an inward-folding electronic device. The foldable electronic device 200 may further include the waveguide 241 formed from one side of the hinge 240 to the other side thereof. Further, the foldable electronic device 200 may further include at least one feeder 341a feeding through one side of the waveguide 241.

According to various embodiments, the waveguide 241 may include a plurality of conductive lines, which may extend at least partially along the hinge cover of the hinge 240 in a width direction. According to an embodiment, the at least one feeder 341a, which may be located to face one side of the waveguide 241, may be disposed in the first housing 210 and formed in an array corresponding to the plurality of conductive lines of the waveguide 241. According to an embodiment, a feeding module 340 including the antenna 341 in the form of an array and another component (e.g., an RFIC 342) may be disposed in the first housing 210. For example, the feeding module 340 may include the antenna 341 or the RFIC 342. The feeding module 340 may be electrically connected to the transceiver 212d (e.g., the IF RF transceiver).

According to various embodiments, when the foldable electronic device 200 has a third predetermined angle in the unfolded state, the foldable electronic device 200 may communicate with an external electronic device (e.g., the BS 201) using the waveguide 241. The feeder 341a may be electrically connected to each conductive line of the waveguide 241. For example, when the first housing 210 and the second housing 220 of the foldable electronic device 200 are unfolded at an angle less than 90 degrees, mmWave radio waves transmitted from the antenna 341 may be excited through the feeder 341a located at an end of the waveguide 241. In this case, the waveguide 241 may function as a waveguide antenna 350.

Figure 14:
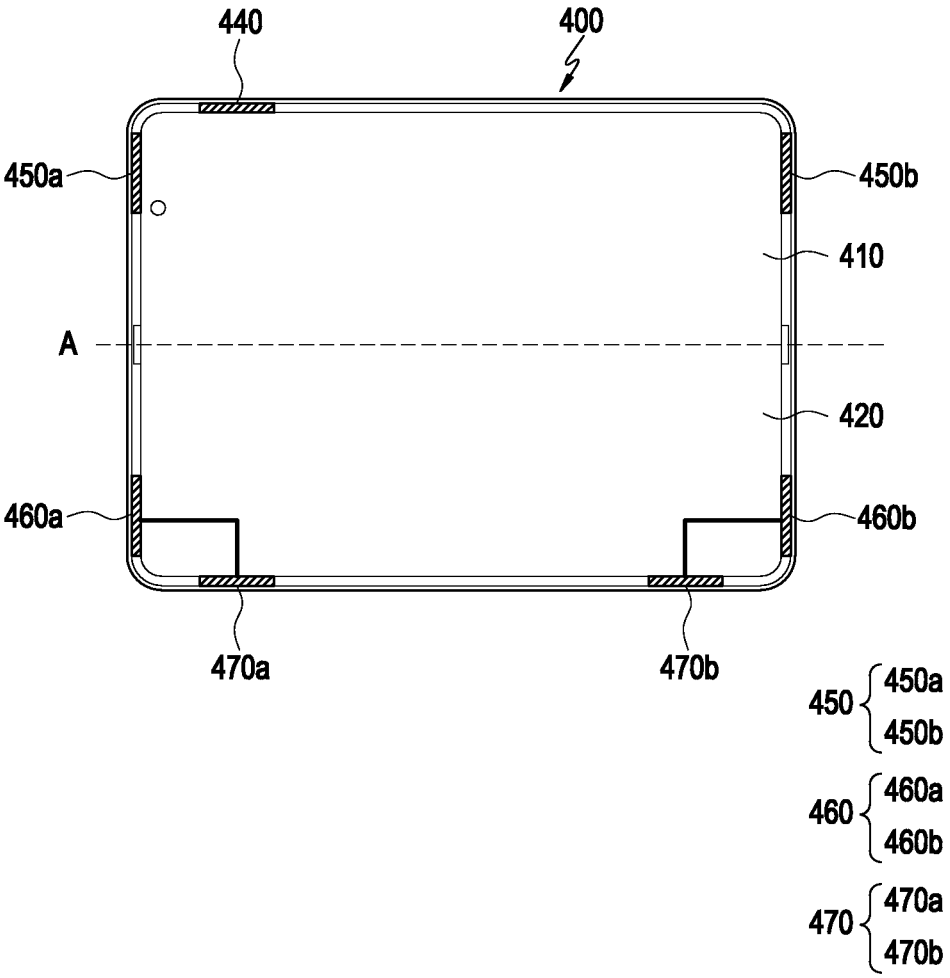
FIG. 14 is a diagram illustrating couplers in a foldable electronic device according to an embodiment of the disclosure.
Figure 15:
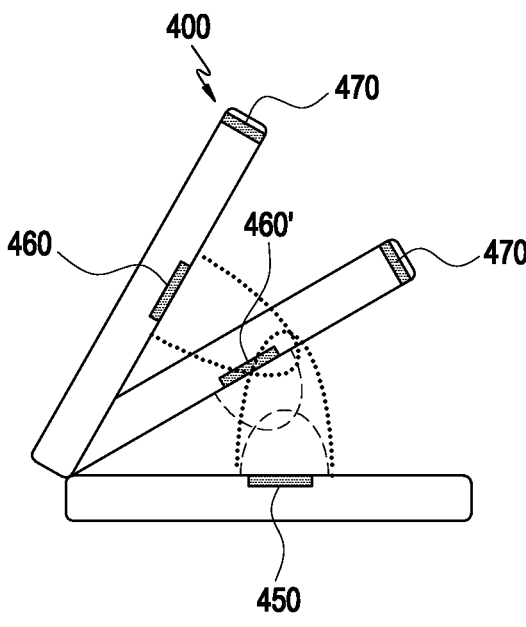
FIG. 15 is a diagram illustrating a method of adjusting an antenna gain in a foldable electronic device according to an embodiment of the disclosure.
Figure 16:
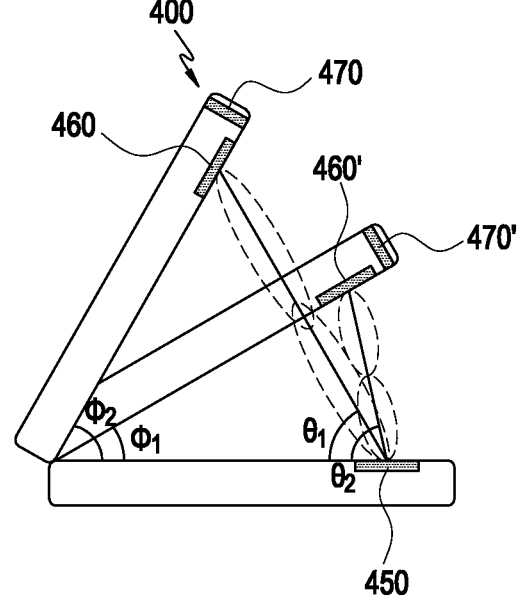
FIG. 16 is a diagram illustrating a method of adjusting a beam forming direction in a foldable electronic device according to an embodiment of the disclosure.

FIG. 13 is a block diagram illustrating the foldable electronic device 200 according to an embodiment of the disclosure. FIG. 14 is a diagram illustrating couplers in the foldable electronic device 200 according to an embodiment of the disclosure. FIG. 15 is a diagram illustrating a method of adjusting an antenna gain of the foldable electronic device 200 according to an embodiment of the disclosure. FIG. 16 is a diagram illustrating a method of adjusting a beam forming direction of the foldable electronic device 200 according to an embodiment of the disclosure.

According to various embodiments of the disclosure, the foldable electronic device 200 may include repeater antennas 360 and 370 as at least one second antenna included in the foldable electronic device 200, additionally or alternatively to the embodiment illustrated in FIG. 4.

According to various embodiments, the first repeater antenna 360 may include an RFIC 362 or a first coupler 361. The second repeater antenna 370 may include a second coupler 371, an RF front-end (RFFE) IC 372, or an antenna 375.

According to various embodiments, the RFIC 362 may convert an IF signal received from the IF RF transceiver 212d into an RF signal. The RF signal may be transmitted to the RFFE IC 372 through the second coupler 371 coupled to the first coupler 361. The RFFE IC 372 may amplify the RF signal and transmit the amplified RF signal to the antenna 375. The amplified RF signal may be radiated through antenna 375. According to the embodiment of FIG. 13, the processor 212a (or the auxiliary processor (e.g., the CP 212b)) may control a gain and beam forming of the antenna 375, using the RFFE IC 372 based on a folding angle of the electronic device. According to various embodiments, the antenna 375 may transmit or receive signals to or from an external electronic device (e.g., a BS 201) using the second coupler 371 (e.g., the second coupler 321 of FIG. 4) coupled to the first coupler 361 (e.g., the first coupler 311 of FIG. 4), based at least in part on a command from the processor 212a. For example, when communication performance is not secured during communication using the antenna 212c, the processor 212a may communicate with the external electronic device (e.g., the BS 201) using the repeater antenna 375.

In the embodiment of FIG. 13, the first coupler 361 may have substantially the same configuration as or a different configuration from that of the first coupler 311 in the embodiment of FIG. 4. In another example, the second coupler 371 may have substantially the same configuration as or a different configuration from that of the second coupler 321 in the embodiment of FIG. 4. Accordingly, the antenna 375 in the embodiment of FIG. 13 may have substantially the same configuration as that of the second antenna 325 in the embodiment of FIG. 4.

According to various embodiments, when the second housing 420 is folded with respect to the first housing 410, the first coupler 450 may be disposed on at least one side surface of a first housing 410, and the second coupler 460 may be disposed on a side surface of a second housing 420, corresponding to the at least one side surface of the first housing 410. According to an embodiment, as illustrated in FIG. 14, the first coupler 450 may include two first couplers 450a and 450b disposed symmetrically on one side surface and the other side surface of the first housing 410. Correspondingly, the second coupler 460 may include two second couplers 460a and 460b disposed symmetrically on one side surface and the other side surface of the second housing 420. However, the disclosure is not necessarily limited to this. As illustrated, the first coupler 450 may include three or more couplers, and correspondingly, the second coupler 460 may also include three or more couplers.

According to various embodiments, an antenna 440 (e.g., the antenna 212c of FIG. 13) may be disposed in the first housing 410 of an electronic device 400 (e.g., the electronic device 100 of FIG. 1). A processor (e.g., the processor 212a of FIG. 13) may control the antenna 440 to communicate with an external electronic device (e.g., the BS 201 of FIG. 13). In an embodiment, when communication may not be performed smoothly using the antenna 440, such as when a user is gripping the electronic device, covering the antenna 440 with the user's fingers, the coverage of the antenna 440 may be limited.

Accordingly, according to various embodiments of the disclosure, the electronic device 400 may be provided with the first coupler 450 adjacent to the antenna 440 in the first housing 410, and transmit or receive signals transmitted and/or received by the antenna 440 through the repeater antenna 470, using the second coupler 460 coupled to the first coupler 450. The number of repeater antennas 470 may correspond to the first coupler 450 and the second coupler 460. For example, when each of the first coupler 450 and the second coupler 460 may include two couplers as illustrated in FIG. 14, there may be two repeater antennas 470. Various other embodiments are applicable.

Referring to FIGS. 13 and 15 together, according to various embodiments, the processor 212a may control a signal gain based at least in part on the distance between the first coupler 450 and the second coupler 460. The distance between the first coupler 450 and the second coupler 460 may be determined based on the folding angle between the first housing 410 and the second housing 420. As illustrated in FIG. 15, the first coupler 450 and the second coupler 460 may increase the signal gain to obtain a higher communication efficiency (e.g., when communicating with an external electronic device located outside of the electronic device 400), and decrease the signal gain to prevent efficiency degradation caused by radio wave interference (e.g., when performing signal transfer between internal components of the electronic device 400).

According to various embodiments, the RFIC 362 or RFFE IC 372 may control a signal gain based on an angle formed by the first housing 210 and the second housing 220.

Referring to FIG. 16, according to various embodiments, the processor 212a may control beam forming based at least in part on the distance between the first coupler 450 and the second coupler 460. The distance between the first coupler 450 and the second coupler 460 may be determined based on the folding angle between the first housing 410 and the second housing 420. Additionally or alternatively to the signal gain control, the beam forming control may be performed.

According to various embodiments, the RFIC 362 may control a beam forming angle of the first coupler 361 based on the angle formed by the first housing 210 and the second housing 220. In another example, the RFFE IC 372 may control a beam forming angle of the second coupler 371 based on the angle formed by the first housing 210 and the second housing 220.

Figure 17A:
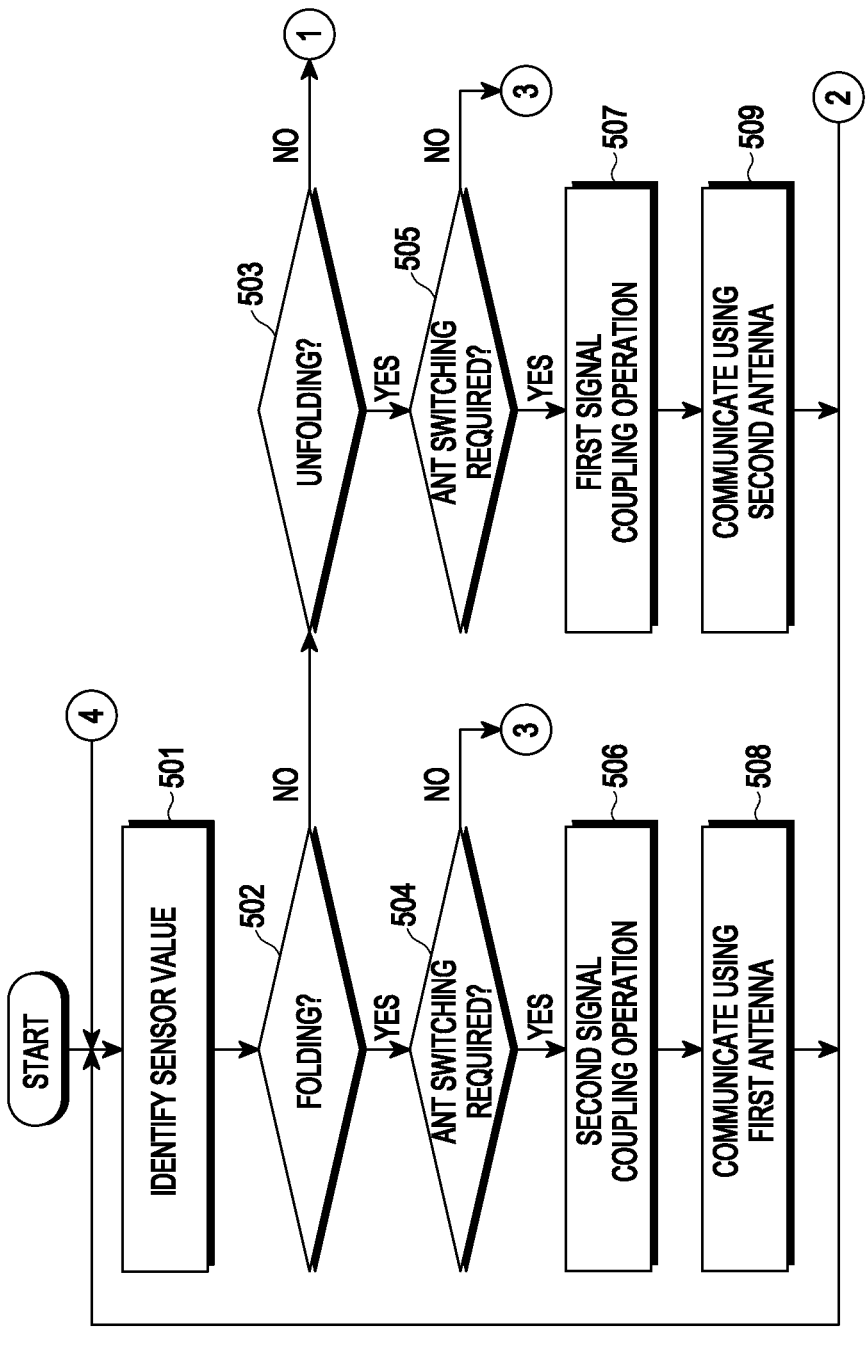
FIG. 17A is a flowchart illustrating a method of operating a foldable electronic device according to an embodiment of the disclosure.
Figure 17B:
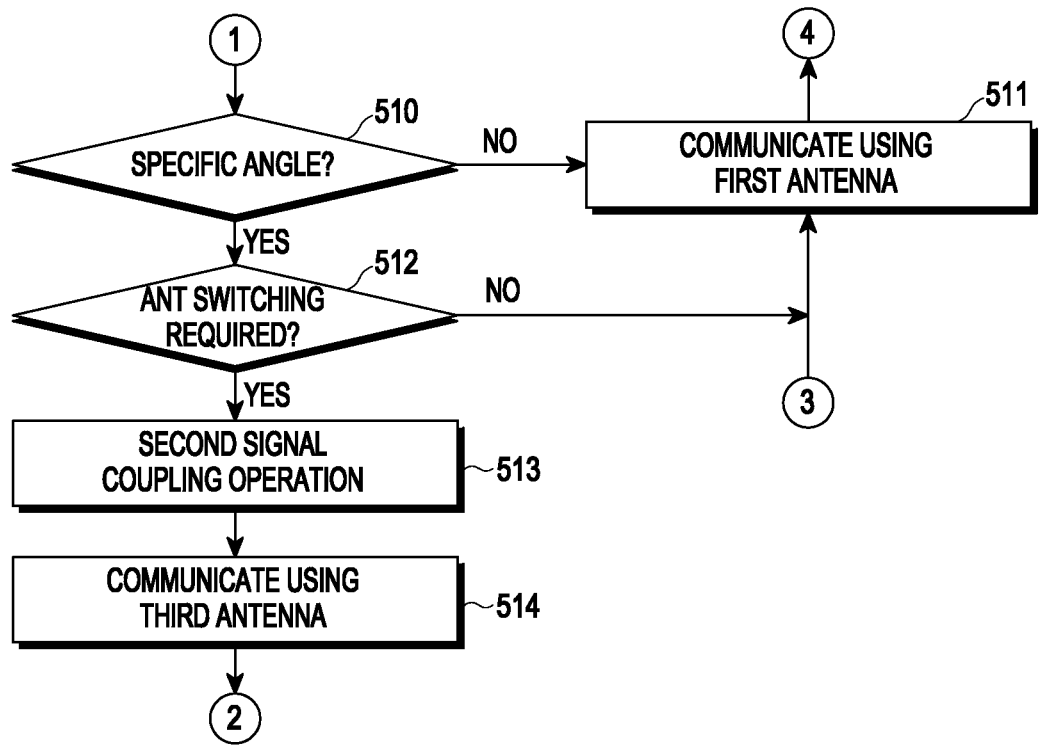
FIG. 17B is a flowchart illustrating a method of operating a foldable electronic device according to an embodiment of the disclosure.

FIG. 17A is a flowchart illustrating a method of operating a foldable electronic device according to an embodiment of the disclosure. FIG. 17B is a flowchart illustrating a method of operating a foldable electronic device according to an embodiment of the disclosure.

The operation methods of FIGS. 17A and 17B may be performed by a processor (e.g., the processor 212a of FIG. 4) of a foldable electronic device (e.g., the foldable electronic device 200 of FIG. 4).

In operation 501, the processor 212a (e.g., AP) may identify a value sensed by a sensor (e.g., the sensor 212f of FIG. 4).

In operation 502, the processor 212a (e.g., AP) may determine whether the foldable electronic device is folded. If the foldable electronic device is determined to be folded, the method may proceed to operation 504.

In operation 503, when the device is determined to not be in the folded state, the processor 212a (e.g., AP) may determine whether the foldable electronic device is unfolded.

In operation 504 or operation 505, when the foldable electronic device is determined to be in the folded state or the unfolded state, respectively, the processor 212a (e.g., AP) may determine whether antenna switching is required. Determining whether antenna switching is required may be to determine whether the communication efficiency of a second antenna (e.g., the antenna 325 of FIG. 4) (or the third antenna 335 of FIG. 4) is higher than that of a first antenna (e.g., the antenna 212c of FIG. 4) in performing communication with an external electronic device, and control to use an antenna with a higher communication efficiency based on the determination.

In operation 506, when antenna switching is required as determined in operation 504, the processor 212a (e.g., AP) may control the switch 313 to electrically connect the RFIC 314 and the third coupler 312 to each other, such that a signal is transmitted through the third coupler 312 and the fourth coupler 332.

In operation 508, when the foldable electronic device is in the folded state, the processor 212a (e.g., AP; application) may perform communication through an antenna (e.g., the third antenna 335) located on a hinge cover (e.g., the hinge cover 245 of FIG. 4) using the third coupler 312 and the fourth coupler 332.

In operation 507, when antenna switching is required in the unfolded state as determined in operation 505, the processor 212a (e.g., AP) may control the switch 313 to electrically connect the RFIC 314 and the first coupler 311 to each other, such that a signal is transmitted through the first coupler 311 and the second coupler 321 in operation 507.

In operation 509, the processor 212a may perform communication through an antenna (e.g., the second antenna 325) located in a second housing (e.g., the second housing 220 of FIG. 4), using the first coupler 311 and the second coupler 321.

In operation 510, when the electronic device is determined to not be in either the folded state or the unfolded state, the processor 212a may identify an angle formed by the first housing and the second housing. When the angle is not a predetermined angle, operation 511 may be performed, and when the angle is a predetermined angle, operation 512 may be performed. For example, the predetermined angle may be greater than 0 degrees and less than 150 degrees.

In operation 511, when the first housing and the second housing do not have the predetermined angle, communication may be performed through the first antenna located in the first housing. Operation 511 may also be performed when antenna switching is not required as determined in operation 505

In operation 512, the processor 212a may identify whether antenna switching is required. When antenna switching is not required, the processor 212a may perform communication using the first antenna located in the first housing (e.g., operation 511).

When determining that antenna switching is required in operation 512, the processor 212a may control the switch 313 to electrically connect the RFIC 314 and the third coupler 312 to each other, such that a signal is transmitted through the third coupler 312 and the fourth coupler 332 in operation 513.

In operation 514, the processor 212a (e.g., AP) may perform communication through the antenna (e.g., the third antenna 335) located on the hinge cover (e.g., the hinge cover 245 in FIG. 4), using the third coupler 312 and the fourth coupler 332.

Figure 18:
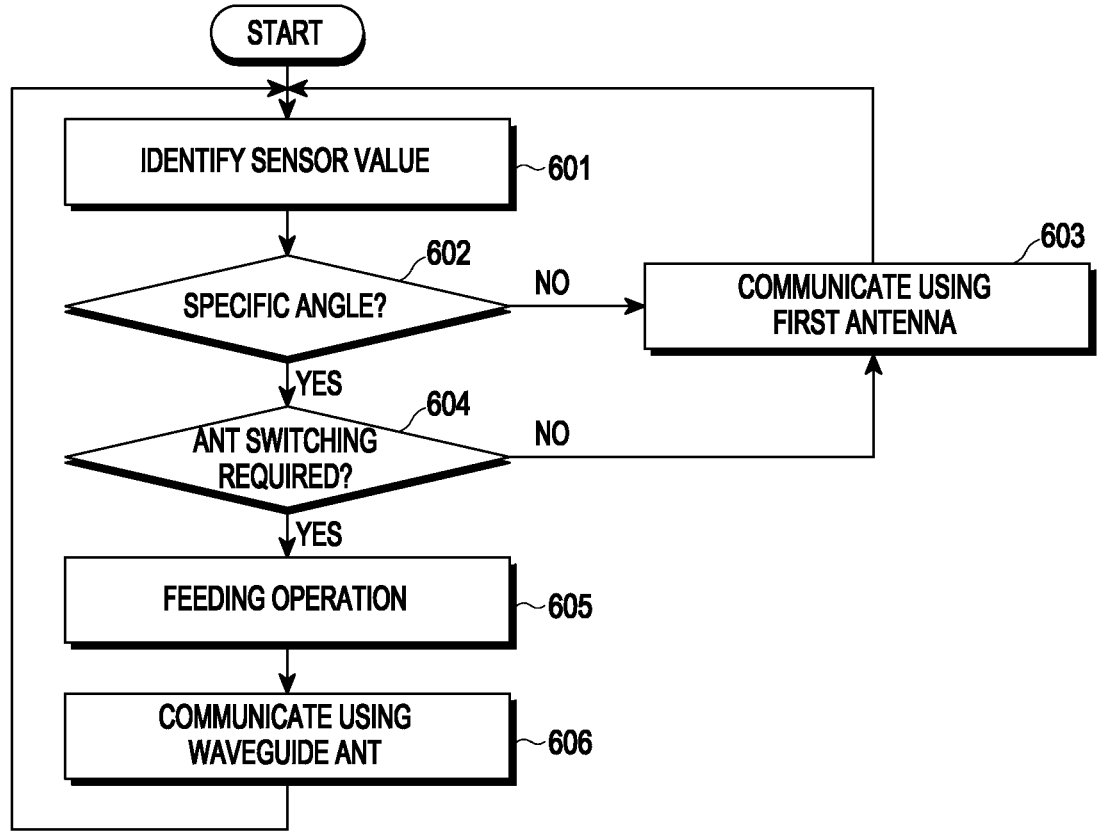
FIG. 18 is a flowchart illustrating a method of operating a foldable electronic device using a waveguide according to an embodiment of the disclosure.

FIG. 18 is a flowchart illustrating a method of operating a foldable electronic device using a waveguide according to an embodiment of the disclosure.

The operation method of FIG. 18 may be performed by a processor (e.g., the processor 212a of FIG. 4) of the foldable electronic device.

In operation 601, the processor 212a (e.g., AP) may determine a value sensed by a sensor (e.g., the sensor 212f of FIG. 10). In operation 602, the processor 212a may determine whether the foldable electronic device forms a predetermined angle. When the foldable electronic device does not form the predetermined angle, the processor 212a may perform communication through a conventional first antenna located in a first housing in operation 603. When the foldable electronic device forms the predetermined angle (e.g., 90 degrees), the processor 212a may determine whether antenna switching is required in operation 604. Determining whether antenna switching is required may include determining whether the communication efficiency of a waveguide antenna (e.g., the waveguide antenna 350 of FIG. 10) is higher than that of the first antenna (e.g., the antenna 212c of FIG. 4) in communication with an external electronic device (an antenna with a higher communication efficiency may be used based on the determination). When antenna switching is required, the processor (e.g., AP) may perform a feeding operation using the feeding module 340 in operation 605 and perform communication using the waveguide antenna bin operation 606.

Figure 19:
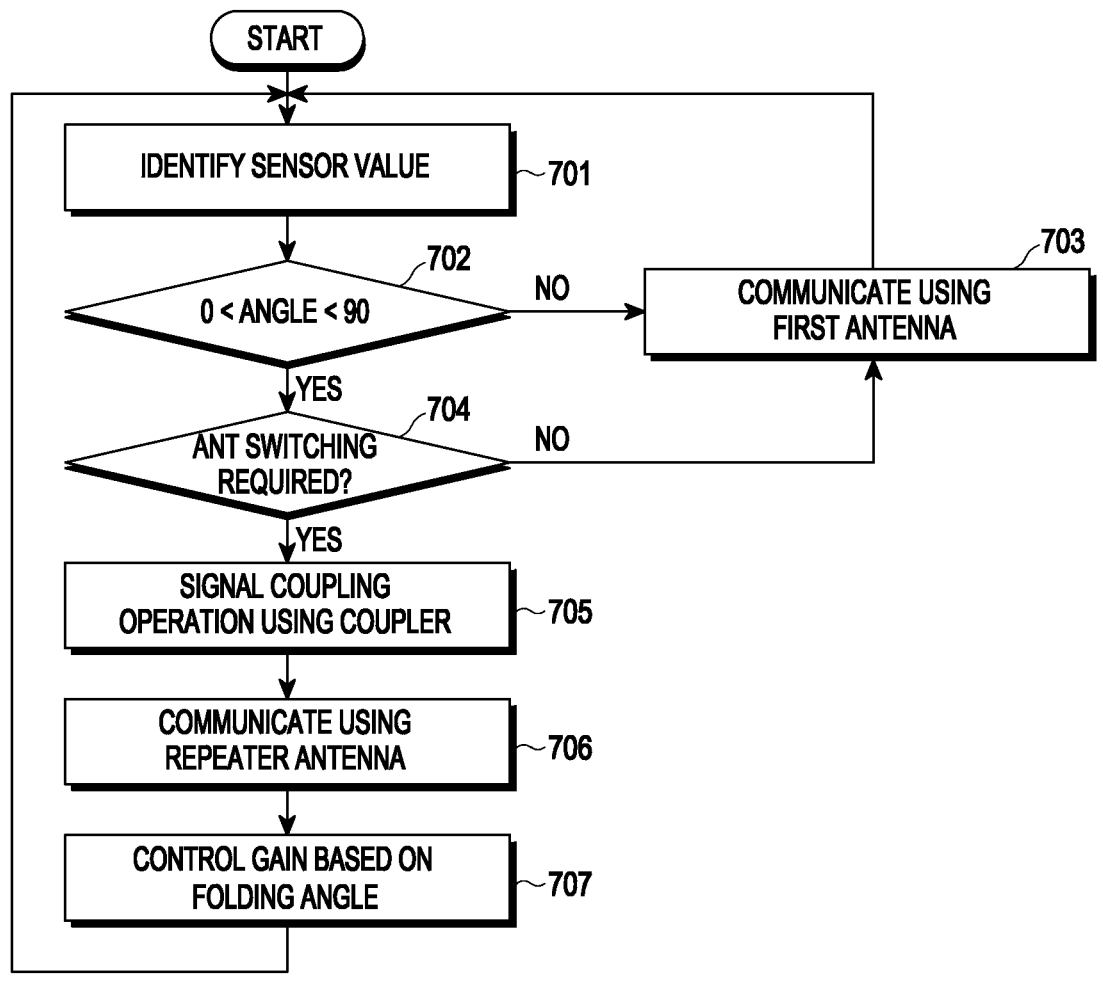
FIG. 19 is a flowchart illustrating a method of operating a foldable electronic device using a repeater antenna according to an embodiment of the disclosure.
Figure 20:
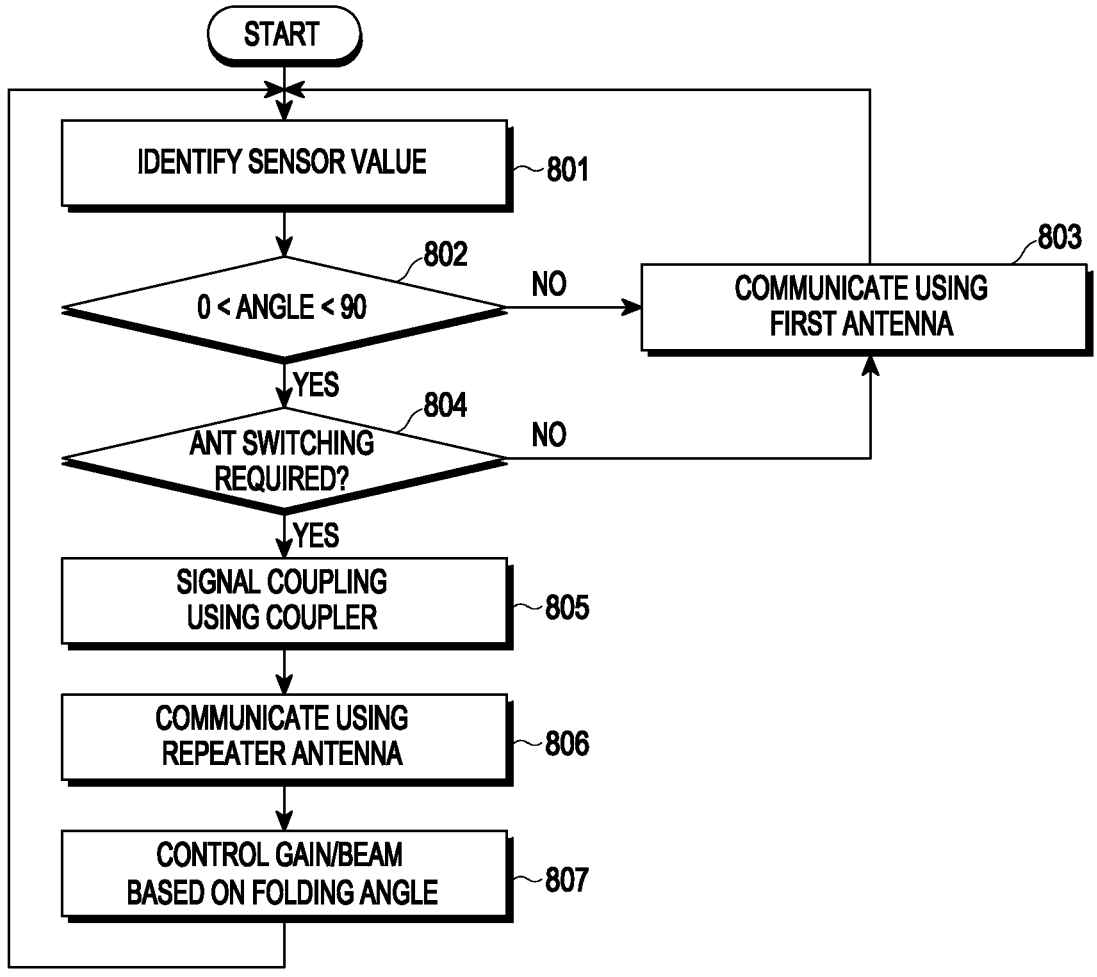
FIG. 20 is a flowchart illustrating a method of operating a foldable electronic device using a repeater antenna according to an embodiment of the disclosure.

FIG. 19 is a flowchart illustrating a method of operating a foldable electronic device using a repeater antenna (e.g., the repeater antenna 470 of FIG. 14) according to an embodiment of the disclosure. FIG. 20 is a flowchart illustrating a method of operating a foldable electronic device using a repeater antenna (e.g., the repeater antenna 470 of FIG. 14) according to an embodiment of the disclosure.

The operation methods of FIGS. 19 and 20 may be performed by a processor (e.g., processor 212a of FIG. 4) of the foldable electronic device. In operation 701 (or operation 801), the processor 212a (e.g., AP) may identify a value sensed by a sensor (e.g., the sensor 212f of FIG. 10). In operation 702 (or operation 802), the processor 212a may determine whether the foldable electronic device forms a predetermined angle (e.g., 0 degrees to 90 degrees). When the foldable electronic device does not form the predetermined angle, the processor 212a may perform communication through a conventional first antenna located in a first housing in operation 703 (or operation 803). When the foldable electronic device forms the predetermined angle (e.g., 45 degrees), the processor 212a may determine whether antenna switching is required in operation 704 (or operation 804). Determining whether antenna switching is required may include determining whether the communication efficiency of a repeater antenna (e.g., 470 in FIG. 14) is higher than that of the first antenna (e.g., the antenna 440 of FIG. 14) in communication with an external electronic device (an antenna with a higher communication efficiency may be used based on the determination). When antenna switching is required, the processor (e.g., AP) may perform signal coupling and communication through the repeater antenna 470 in operations 705 and 706 (or operations 805 and 806). In operation 707, according to an embodiment, the foldable electronic device may perform control by increasing and/or decreasing a coupling gain of a coupler based on a folding angle of the foldable electronic device (e.g., see the embodiment of FIG. 15). According to another embodiment, in operation 807, the processor 212a may control a beam forming direction of an antenna beam together with the coupling gain of the coupler (e.g., see the embodiment of FIG. 16).

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "$1^{st}$" and "$2^{nd}$", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or through a third element.

As used in connection with various embodiments of the disclosure, the term "module" may include a unit implemented in hardware, software, or firmware, and may interchangeably be used with other terms, for example, logic, logic block, part, or circuitry. A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., a program) including one or more instructions that are stored in a storage medium (e.g., internal memory or external memory) that is readable by a machine (e.g., an electronic device). For example, a processor of the machine (e.g., the electronic device) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" may indicate that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online through an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to various embodiments of the disclosure, a foldable electronic device (e.g., the foldable electronic device 200 of FIG. 4) may include a first housing (e.g., the first housing 210 of FIG. 4) in which a first component is disposed, a second housing (e.g., the second housing 220 of FIG. 4) in which a second component is disposed, a hinge (e.g., the hinge 240 of FIG. 4) rotatably connecting the first housing and the second housing to each other, a flexible display (e.g., the flexible display 230 of FIG. 5) disposed to extend from one surface of the first housing, across an area in which the hinge is disposed, to one surface of the second housing, and a coupler configured to transmit a signal between the first component and the second component. The coupler may include a first coupler (e.g., the first coupler 311 of FIG. 4) electrically connected to the first component, and a second coupler (e.g., the second coupler 321 of FIG. 4) electrically connected to the second component, the second coupler disposed at a position corresponding to the first coupler and configured to transmit or receive a signal to or from the first coupler by coupling to the first coupler.

According to various embodiments, the first state of the electronic device may be an unfolded state of the electronic device.

According to various embodiments, the first coupler and the second coupler may be disposed adjacent to a rear surface of the flexible display, at a position corresponding to a folding area on the hinge.

According to various embodiments, the first coupler and the second coupler may be formed on an FPCB having a rigid end, the first coupler may extend from the first housing and the second coupler may extend from the second housing.

According to various embodiments, the first component may include at least one first antenna (e.g., the first antenna 212c of FIG. 4) and a processor, and the second component may include at least one second antenna (e.g., the second antenna 325 of FIG. 4).

According to various embodiments, the hinge may include at least one third antenna (e.g., the third antenna 335 of FIG. 4).

According to various embodiments, the foldable electronic device may further include a third coupler (e.g., the third coupler 312 of FIG. 4) electrically connected to the first component, and a fourth coupler (e.g., the fourth coupler 332 of FIG. 4) electrically connected to the at least one third antenna.

According to various embodiments, the fourth coupler may be disposed at a position corresponding to the third coupler and configured to transmit or receive a signal to or from the third coupler by coupling to the third coupler in a second state of the electronic device.

According to various embodiments, the second state of the electronic device may be a folded state or a state in which a folding angle between the first housing and the second housing is within a predetermined angular range.

According to various embodiments, the first coupler and the second coupler may be configured to transmit or receive a signal in an mmWave band.

According to various embodiments, the first component may include at least one first antenna and a processor, the second component may include at least one second antenna. The at least one second antenna may be a repeater antenna configured to receive a signal to be transmitted by the at least one first antenna from the second coupler coupled to the first coupler and configured to transmit the signal through the at least one second antenna, based at least in part on a command from the processor (e.g., the processor 212a of FIG. 4).

According to various embodiments, the first coupler may be disposed on a first side surface of the first housing, and when the second housing is folded with respect to the first housing, the second coupler may be disposed on a side surface of the second housing corresponding to the first side surface of the first housing.

According to various embodiments, the processor may control a signal gain based at least in part on a distance between the first coupler and the second coupler, and the distance between the first coupler and the second coupler may be determined based on a folding angle between the first housing and the second housing.

According to various embodiments, the processor may control beam forming, based at least in part on a distance between the first coupler and the second coupler and the distance between the first coupler and the second coupler may be determined based on a folding angle between the first housing and the second housing.

According to various embodiments, the hinge may include a waveguide antenna (e.g., the waveguide antenna 350 of FIG. 10).

According to various embodiments of the disclosure, a foldable electronic device (e.g., the foldable electronic device 200 of FIG. 4) may include a first housing (e.g., the first housing 210 of FIG. 4) having a first component disposed therein, a second housing (e.g., the second housing 220 of FIG. 4) having a second component disposed therein, a hinge (e.g., the hinge 240 of FIG. 4) rotatably connecting the first housing and the second housing to each other and having a third component disposed therein, a flexible display (e.g., the flexible display 230 of FIG. 5) disposed to extend from one surface of the first housing, across an area in which the hinge is disposed, to one surface of the second housing, and a coupler. The coupler may include a first coupler (e.g., the first coupler 311 of FIG. 4) electrically connected to the first component, a second coupler (e.g., the second coupler 321 of FIG. 4) electrically connected to the second component, and in an unfolded state of the electronic device, the second coupler may transmit or receive a signal to or from the first coupler by coupling to the first coupler, a third coupler (e.g., the third coupler 312 of FIG. 4) electrically connected to the first component, and a fourth coupler (e.g., the fourth coupler 332 of FIG. 4) disposed at a position corresponding to the third coupler and transmitting or receiving a signal to or from the third coupler by coupling to the third coupler in a folded state or when the first housing and the second housing have a predetermined angular range therebetween.

According to various embodiments, the first coupler and the second coupler may be disposed adjacent to a rear surface of the flexible display, in a folding area on the hinge.

According to various embodiments, the first coupler, the second coupler, and the third coupler may transmit or receive a signal in an mmWave band.

According to various embodiments, a foldable electronic device (e.g., the foldable electronic device 200 of FIG. 10) includes a first housing (e.g., the first housing 210 of FIG. 10) having a first component disposed therein, a second housing (e.g., the second housing 220 of FIG. 10) having a second component disposed therein, a hinge (e.g., the hinge 240 of FIG. 10) rotatably connecting the first housing and the second housing to each other, a flexible display (e.g., the flexible display 230 of FIG. 11) disposed to extend from one surface of the first housing, across an area in which the hinge is disposed, to one surface of the second housing, a waveguide (e.g., the waveguide 241 of FIG. 12) formed to penetrate from one side to the other side of the hinge, and at least one antenna (e.g., the antenna 341 of FIG. 13) feeding through one side of the waveguide.

According to various embodiments, the at least one antenna may excite the waveguide based at least in part on a command from a processor disposed in the first housing.

An electronic device according to various embodiments of the disclosure may secure coverage of mmWave communication in an unfolded state, a folded state, or a folded state within a predetermined angle (e.g., less than 90 degrees) by a coupler or waveguide antenna structure implemented in a hinge of a foldable electronic device.

An electronic device according to various embodiments of the disclosure may secure coverage of mmWave communication in a folded state within a predetermined angle (e.g., less than 90 degrees) through an active repeater and a coupler applied to a foldable electronic device.

The embodiments of the disclosure disclosed in the specification and the drawings provide merely specific examples to easily describe technical content according to the embodiments of the disclosure and help the understanding of the embodiments of the disclosure, not intended to limit the scope of the embodiments of the disclosure. Accordingly, the scope of various embodiments of the disclosure should be interpreted as encompassing all modifications or variations derived based on the technical spirit of various embodiments of the disclosure in addition to the embodiments disclosed herein.

What is claimed is:

1. A foldable electronic device comprising:
a first housing in which a first component is provided, the first component comprising at least one first antenna and a processor;
a second housing in which a second component is provided, the second component comprising at least one second antenna;
a hinge foldably connecting the first housing and the second housing;
a flexible display extending from a first surface of the first housing to a first surface of the second housing and across an area in which the hinge is provided; and
a first coupler electrically connected to the first component; and
a second coupler electrically connected to the second component and provided at a position corresponding to the first coupler in the area such that the second coupler is coupled to the first coupler in an unfolded state of the foldable electronic device and the second coupler is decoupled from the first coupler in a folded state of the foldable electronic device,
wherein the second coupler is configured to transmit a signal to or receive a signal from the first coupler by coupling to the first coupler in the unfolded state of the foldable electronic device.

2. The foldable electronic device of claim 1, wherein the first coupler and the second coupler are adjacent to a rear surface of the flexible display, at a position corresponding to a folding area on the hinge.

3. The foldable electronic device of claim 1, wherein the first coupler and the second coupler are provided on a flexible printed circuit board (FPCB) comprising a rigid end, wherein the first coupler extends from the first housing, and wherein the second coupler extends from the second housing.

4. The foldable electronic device of claim 1, wherein the hinge comprises at least one third antenna.

5. The foldable electronic device of claim 4, further comprising:

a third coupler electrically connected to the first component; and a fourth coupler electrically connected to the at least one third antenna.

6. The foldable electronic device of claim 5, wherein the fourth coupler is provided at a position corresponding to the third coupler, and wherein the fourth coupler is configured to transmit a signal to or receive a signal from the third coupler by coupling to the third coupler in the folded state of the foldable electronic device.

7. The foldable electronic device of claim 6, wherein the folded state comprises a state in which a folding angle between the first housing and the second housing is within a predetermined angular range.

8. The foldable electronic device of claim 1, wherein the first coupler and the second coupler are configured to transmit or receive a signal in a millimeter wave (mmWave) band.

9. The foldable electronic device of claim 1, wherein the at least one second antenna is a repeater antenna configured to:

receive a first signal transmitted by the at least one first antenna from the second coupler coupled to the first coupler; and transmit the first signal by the at least one second antenna based at least in part on a command from the processor.

10. The foldable electronic device of claim 9, wherein the first coupler is on a first side surface of the first housing, and wherein, in a state where the second housing is folded with respect to the first housing, the second coupler is on a side surface of the second housing that corresponds to the first side surface of the first housing.

11. The foldable electronic device of claim 9, wherein the processor is configured to control a signal gain based at least in part on a distance between the first coupler and the second coupler, the distance between the first coupler and the second coupler being determined based on a folding angle between the first housing and the second housing.

12. The foldable electronic device of claim 9, wherein the processor is configured to control beam forming based at least in part on a distance between the first coupler and the second coupler, the distance between the first coupler and the second coupler being determined based on a folding angle between the first housing and the second housing.

13. The foldable electronic device of claim 1, wherein the hinge comprises a waveguide antenna.

14. A foldable electronic device comprising:

a first housing;

a second housing;

a hinge foldably connecting the first housing and the second housing; and a flexible display extending from the first housing, across the hinge, to the second housing;

a first coupler provided in the first housing; and a second coupler provided in the second housing, wherein, in an unfolded state of the foldable electronic device, the second coupler is configured to be coupled to the first coupler such that the second coupler transmits or receives a signal to or from the first coupler, and wherein, in a folded state of the foldable electronic device, the second coupler is decoupled from the first coupler.

15. The foldable electronic device of claim 14, wherein the hinge comprises at least one antenna.

16. The foldable electronic device of claim 15, further comprising:

a third coupler provided in the first housing; and a fourth coupler provided in the hinge and connected to the at least one antenna.

17. The foldable electronic device of claim 16, wherein, in the folded state of the foldable electronic device, the fourth coupler is configured to be coupled to the third coupler such that the fourth coupler transmits or receives a signal to or from the third coupler.

18. A foldable electronic device, comprising:

a first housing;

a second housing;

a hinge connecting the first housing and the second housing;

a flexible display extending from the first housing, across the hinge, to the second housing;

a first coupler provided in the first housing;

a second coupler provided in the second housing;

a third coupler provided in the first housing; and a fourth coupler provided in the hinge, wherein, in an unfolded state of the foldable electronic device, the second coupler is configured to be coupled to the first coupler such that the second coupler transmits or receives a signal to or from the first coupler, wherein, in a folded state of the foldable electronic device, the fourth coupler is configured to be coupled to the third coupler such that the fourth coupler transmits or receives a signal to or from the third coupler, and wherein, in the folded state of the foldable electronic device, the second coupler is decoupled from the first coupler.

* * * * *